United States Patent
Nara et al.

(10) Patent No.: US 8,262,974 B2
(45) Date of Patent: Sep. 11, 2012

(54) METHOD FOR MANUFACTURING DISPLAY ELEMENT AND MANUFACTURING APPARATUS OF DISPLAY ELEMENT

(75) Inventors: Kei Nara, Yokohama (JP); Tomohide Hamada, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/721,023

(22) Filed: Mar. 10, 2010

(65) Prior Publication Data

US 2010/0164130 A1 Jul. 1, 2010

Related U.S. Application Data

(63) Continuation of application No. PCT/JP2008/002386, filed on Sep. 1, 2008.

(30) Foreign Application Priority Data

Sep. 11, 2007 (JP) .................................. 2007-235570

(51) Int. Cl.
  *B28B 3/12* (2006.01)
(52) U.S. Cl. .................................. 264/297.6; 264/297.8
(58) Field of Classification Search ............... 264/297.6, 264/297.8; 425/280
  See application file for complete search history.

(56) References Cited

U.S. PATENT DOCUMENTS

| | | | |
|---|---|---|---|
| 3,898,645 A * | 8/1975 | Coberley | 324/178 |
| 5,483,349 A * | 1/1996 | Suzuki | 356/401 |
| 5,929,961 A | 7/1999 | Nishi et al. | |
| 6,320,640 B2 | 11/2001 | Nishi et al. | |
| 6,839,123 B2 | 1/2005 | Nishi et al. | |
| 2002/0195928 A1 * | 12/2002 | Grace et al. | 313/503 |
| 2004/0224433 A1 | 11/2004 | Yamazaki et al. | |

FOREIGN PATENT DOCUMENTS

| | | |
|---|---|---|
| EP | 2 138 992 A1 | 12/2009 |
| EP | 2 196 980 A1 | 6/2010 |
| JP | 2002-367523 | 12/2002 |
| JP | 2003-263119 | 9/2003 |
| JP | 2004-152705 | 5/2004 |
| JP | 3698749 B2 | 7/2005 |
| JP | 2005-283830 | 10/2005 |

OTHER PUBLICATIONS

Written Opinion of the International Searching Authority with English language translation issued in corresponding International Application No. PCT/JP2008/002386 on Nov. 18, 2008.

(Continued)

*Primary Examiner* — Yogendra Gupta
*Assistant Examiner* — Alison Hindenlang
(74) *Attorney, Agent, or Firm* — Finnegan, Henderson, Farabow, Garrett & Dunner, L.L.P.

(57) ABSTRACT

A manufacturing apparatus of display element is provided in which the position of a drive circuit or thin-film transistor on a flexible substrate roll can be confirmed easily. The manufacturing apparatus of display element (100) is provided with a supply roll (RL) that feeds a flexible, elongated substrate (FB) which has been wound into a roll shape in a first direction; a mold (10) that, by pressing onto the fed elongated substrate, forms at least one first index mark (AM) for one row of display elements and partition walls (BA) for a plurality of display elements (50) that are lined up in a second direction which intersects the first direction; and a droplet applying section (20) that applies droplets onto a groove portion formed between the partition walls.

20 Claims, 15 Drawing Sheets

OTHER PUBLICATIONS

International Search Report, from the Japanese Patent Office in corresponding International Application No. PCT/JP2008/002386, mailed Nov. 18, 2008.

Supplementary European Search Report issued in counterpart European Patent Application No. 08 79 0540.2, on Jan. 20, 2011.

Office Action issued in counterpart Chinese Patent Application No. 200880106565.0, on Sep. 26, 2011, pp. 1-13.

* cited by examiner

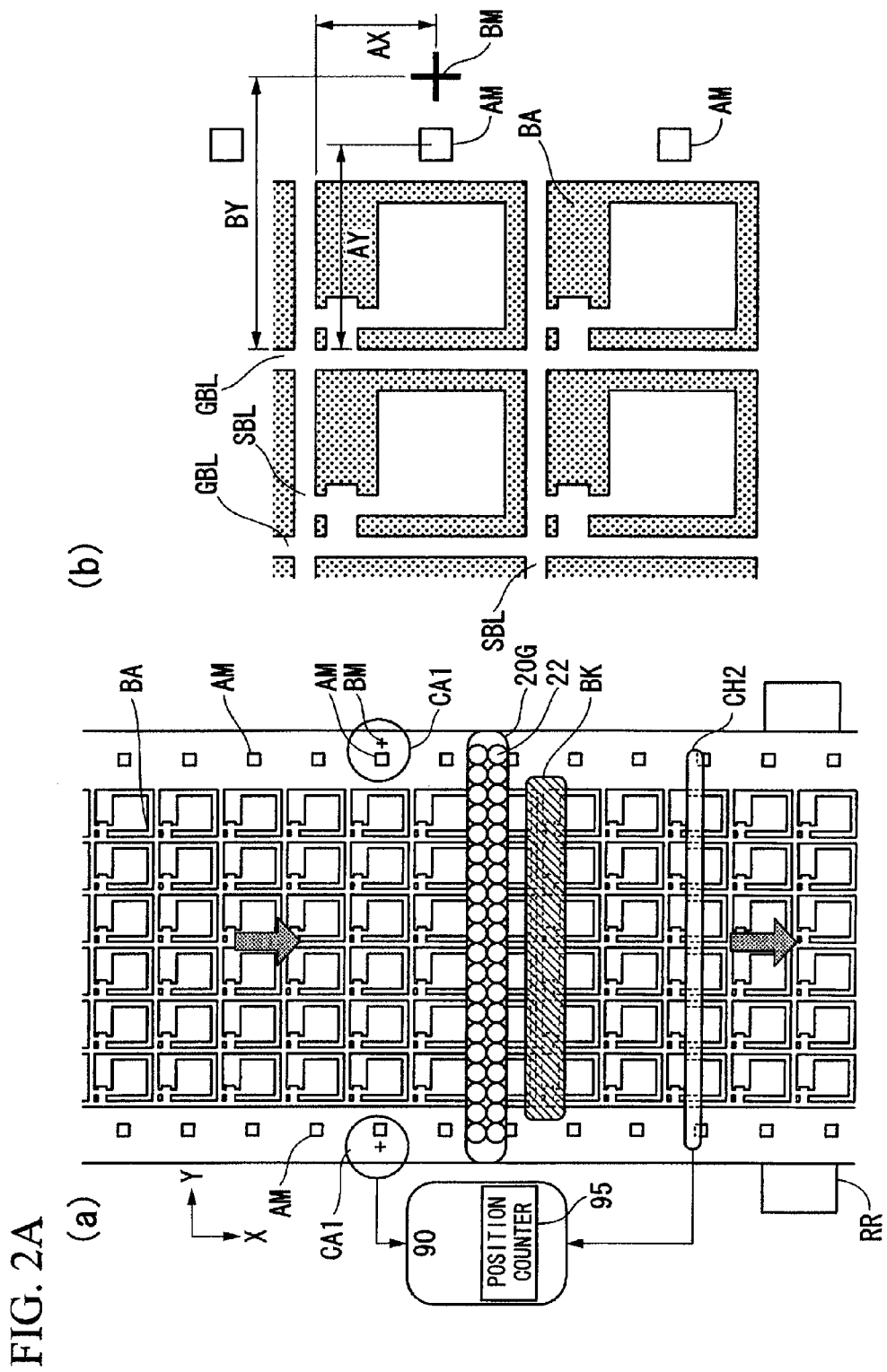

METHOD FOR MANUFACTURING DISPLAY ELEMENT AND MANUFACTURING APPARATUS OF DISPLAY ELEMENT

This is a Continuation Application of International Patent Application No. PCT/JP2008/002386, filed on Sep. 1, 2008.

TECHNICAL FIELD

The present invention relates to a flat panel display element such as an organic electroluminescence (EL) element, a liquid crystal display element, a field emission display (FED), or the like. Furthermore, the present invention also relates to a manufacturing method and manufacturing apparatus of this display element, and particularly relates to a manufacturing method and manufacturing apparatus of a display element that also manufactures a drive circuit that drives a display element.

BACKGROUND

Display elements such as liquid crystal display elements have features that include a small size, a small thickness (thin), low power consumption, and a light weight. Because of this, currently, the display elements are widely used in various types of electronic equipments. Drive circuits or thin-film transistors that drive these display elements are generally manufactured using an exposure apparatus referred to as a stepper.

However, the size of liquid crystal display elements, in particular, is becoming ever larger, and because of issues such as manufacturing costs and device transporting limitations and the like, the eighth and subsequent generations of such elements have reached the point where they cannot be manufactured using technology which is simply a scaled-up extension of the conventional technology as too many problems exist. Moreover, in order to reduce manufacturing costs, in addition to improving efficiency by increasing the substrate size, considerable impediments exist such as reducing device costs, reducing running costs, and improving the yield of large size panels.

Moreover, organic EL and field emission displays and the like have also begun to appear in the market, and reducing device costs and reducing running costs are also big problems in the manufacturing of these next generation display elements as well.

Patent document 1 discloses a method in which liquid crystal display elements are manufactured using a flexible substrate in roll shape as a measure to reduce the device costs of liquid crystal display element and running costs.

[Patent document 1] Japanese Patent Publication No. 3698749
[Patent document 2] U.S. Pat. No. 6,320,640
[Patent document 3] U.S. Pat. No. 6,839,123

SUMMARY

The example disclosed in Patent document 1 discloses a method for manufacturing passive liquid crystal cells which can be easily manufactured. However, this method cannot be used to manufacture display devices having drive circuits or thin-film transistors with high precision which are in current use. Moreover, in Patent document 1, electrodes are formed by applying conductive ink using a droplet applying method. However, this conductive ink is not always applied accurately, and in such cases, those portions where the ink has not been applied accurately have to be either discarded or repaired. A roll shaped flexible substrate has a length between several tens of meters and several hundreds of meters. Therefore, even if defective portions are to be discarded or repaired, it is still difficult to identify these defective portions on a flexible substrate.

Therefore, it is an object of the present invention to provide a method for manufacturing a display element in which it is easy to identify positions even defective portions have occurred in the wiring of a display element or the like, even in a roll shaped flexible substrate. It is a further object of the present invention to provide a manufacturing apparatus of a display element that easily verifies (identifies) the positions of drive circuits or thin-film transistors in a roll shaped flexible substrate.

A method for manufacturing display element according to a first aspect includes: feeding a substrate in a first direction; forming a partition wall for a plurality of display elements by pressing a mold onto the fed substrate, in which the display elements are lined up in a second direction that intersects the first direction; forming at least one first index mark by pressing the mold onto the fed substrate, in which the first index mark is formed for one row of the display elements lined up in the second direction; and applying droplets onto a groove portion formed between the partition walls.

According to this manufacturing method, because a first index mark is formed for each row of display elements which are lined up in the second direction, it is possible to easily ascertain the position of an elongated substrate which is fed in the first direction. Moreover, because the first index mark is formed on a mold, the relationship between one row of display elements and the first marks can be accurately maintained.

A manufacturing apparatus of display element according to a second aspect includes: a supply roll that feeds a substrate in a first direction; a mold that, by pressing onto the fed substrate, forms at least one first index mark for one row of display elements and a partition wall for a plurality of display elements which are lined up in a second direction which intersects the first direction; and a droplet applying section that applies droplets onto a groove portion formed between the partition walls.

Since the first index mark is formed on a mold, the relationship between one row of display elements and the first marks can be accurately maintained in this manufacturing apparatus of display element. In addition, because a first index mark is formed for each row of display elements which are lined up in the second direction, it is possible to easily ascertain the position of an elongated substrate which is fed in the first direction.

EFFECTS OF THE INVENTION

The manufacturing method and manufacturing apparatus of display element according to the present invention make it possible to easily identify positions even on a rolled flexible substrate. In addition, make it possible to ascertain accurate positions due to the fact that the index mark is formed at the same time that partition walls which regulate wiring and the like on a display element are formed.

BRIEF DESCRIPTION OF THE DRAWINGS

FIG. 2A is a conceptual view in which first marks AM and second marks BM are monitored in an electrode formation process of the organic EL manufacturing apparatus 100.

DESCRIPTION OF EMBODIMENTS

The manufacturing apparatus of display element described in the present embodiment can be applied to organic EL elements, liquid crystal display elements, and field emission display elements. A description will now be given of an apparatus and method for manufacturing organic EL elements as a representative example thereof.

[[Manufacturing Apparatus of Organic EL Element]]

In the manufacturing of an organic EL element, it is necessary to form a substrate on which a thin-film transistor (TFT) and pixel electrode are formed. In order to accurately form one or more organic compound layers (i.e., light emitting element layers) which include a light emitting layer on the pixel electrode which is formed on this substrate, it is necessary to form partition wall BA (i.e., a bank layer) simply and accurately in boundary areas between the pixel electrodes.

Figure 1:
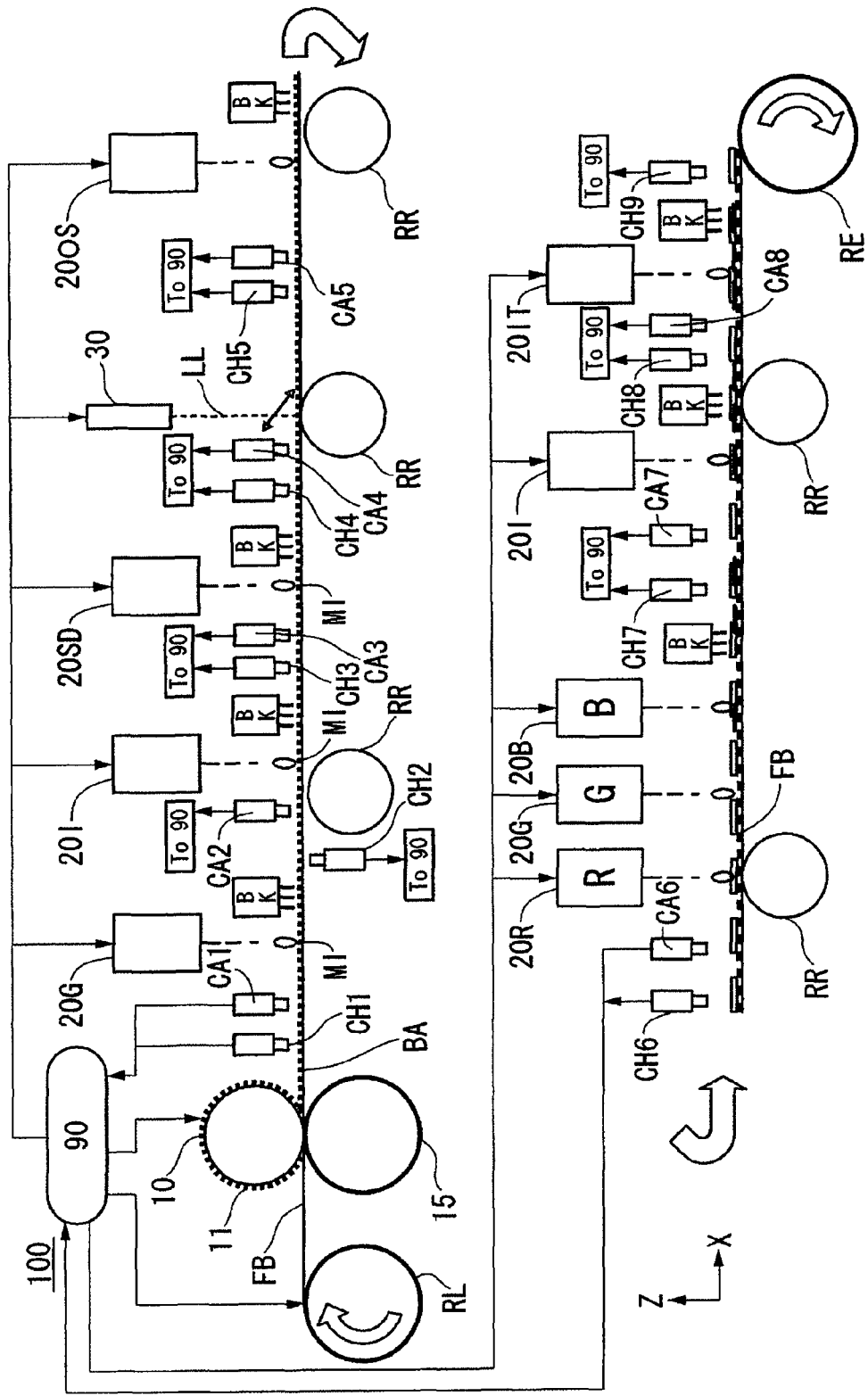
FIG. 1 is a schematic view showing the structure of a manufacturing apparatus 100 that manufactures organic EL elements on a flexible substrate FB.

FIG. 1 is a schematic view showing the structure of a manufacturing apparatus 100 which manufactures organic EL elements 50 which have pixel electrodes and light emitting layers and the like on a flexible substrate.

The manufacturing apparatus 100 of organic EL element is provided with a supply roll RL for feeding a belt-shaped flexible sheet substrate FB which has been wound into a roll shape. The length of the sheet substrate FB is, for example, 200 meters or more. As a result of the supply roll RL rotating at a predetermined speed, the sheet substrate FB is fed in the X-axial direction (i.e., the longitudinal direction) which is the transporting direction. In addition, the manufacturing apparatus 100 of organic EL element is provided with rollers RR in a plurality of locations and the sheet substrate FB is also fed in the X-axial direction by the rotation of these rollers RR. The rollers RR may be rubber rollers which grip the sheet substrate FB from both surfaces thereof, or, if the sheet substrate FB has perforations, then the rollers RR may be ratchet rollers.

The manufacturing apparatus 100 of organic EL element is provided with a wind-up roll RE onto which the sheet substrate FB is wound in a roll shape in the final process thereof. Moreover, in order to perform the processing in the defective portion repair process, the sheet substrate FB is wound onto the wind-up roll RE at a predetermined speed which is synchronized with that of the supply roll RL and the rollers RR.

[Partition Wall Forming Process]

The sheet substrate FB which has been fed from the supply roll RL first undergoes a partition wall forming process in which the partition walls BA are formed on the sheet substrate FB. In the partition wall forming process, the sheet substrate FB is pressed (imprinted; impressed) by an imprint roller 10, and the sheet substrate FB is heated by a heat transfer roller 15 to the glass transition point or more so that the pressed partition walls BA are able to maintain their shape. As a result of this, the mold shape formed on the roller surface of the imprint roller 10 is transferred onto the sheet substrate FB.

The roller surface of the imprint roller 10 is mirror-finished, and a fine imprint mold 11 which is made from a material such as SiC or Ta or the like is mounted on this roller surface. The fine imprint mold 11 has a stamper for thin-film transistor wiring and a stamper for display pixels. In addition, in order to form first marks AM and second marks BM (see FIG. 2A) on both sides in the width direction of the belt-shaped flexible sheet substrate FB, the fine imprint mold 11 also has a stamper for the first marks AM and the second marks BM.

Because the first marks AM and the second marks BM are formed at the same time as the partition walls BA for the thin-film transistor wiring and display pixels, the positional accuracy between the partition walls BA and the first marks AM and second marks BM is the same as the positional accuracy of the fine imprint mold 11.

A first monitoring apparatus CH1 is located downstream in the X-axial direction from the imprint roller 10. The first monitoring apparatus CH1 monitors whether or not the partition walls BA for the thin-film transistor wiring and display pixels have been accurately formed. This first monitoring apparatus CH1 is formed by a camera such as a one-dimensional CCD or two-dimensional CCD or by a laser measuring instrument. A first alignment camera CA1 is located downstream of the first monitoring apparatus CH1.

[Electrode Formation Process]

After the first marks AM and the second marks BM have been detected by the first alignment camera CAL the sheet substrate FB continues to travel in the X-axial direction and undergoes an electrode formation process.

The thin-film transistors (TFT) may employ either inorganic semiconductor based or an organic semiconductor. The thin-film transistors can be formed by employing printing technology or droplet applying technology, if the thin-film transistors are formed using these organic semiconductors.

Among thin-film transistors which use organic semiconductors, field effect transistors (FET) are particularly preferable. The electrode formation process shown in FIG. 1 is described using an FET bottom gate type organic EL element 50. After a gate electrode G, a gate insulating layer I, a source electrode S, a drain electrode D, and a pixel electrode P have been formed on the sheet substrate FB, an organic semiconductor layer OS is formed thereon.

In the electrode formation process, a droplet applying apparatus 20 is used which receives position information from the first alignment camera CA1 and applies droplets onto the sheet substrate FB. An inkjet method or a dispenser method droplet applying apparatus 20 can be used. Examples of an inkjet method include an electrification control method, a pressure vibration method, an electrical-mechanical conversion method, an electrical heat conversion method, and an electrostatic absorption method, and the like. A droplet applying method has a minimum amount of waste of the materials used and can accurately apply a desired quantity of material in a desired position. Hereinafter, the droplet applying apparatus 20 for the gate electrode G is differentiated as gate droplet applying apparatus 20G in which G is added to the end thereof. The same applies for the other droplet applying apparatuses 20. Note that the quantity of one droplet of metal ink MI which is applied using this droplet applying method is between, for example, 1 and 300 nanograms.

The gate droplet applying apparatus 20G applies the metal ink MI inside the partition walls BA of a gate bus line GBL. The metal ink MI is then dried or baked using warm air or radiant heat such as far infrared rays by a heat processing apparatus BK. The gate electrode G is formed as a result of those processing. The metal ink MI is a liquid in which conductive bodies having a grain diameter of approximately 5 nm have been stabilized and dispersed in a solvent which is at room temperature, and carbon, silver (Ag), or gold (Au) or the like is used for the conductive bodies.

A second monitoring apparatus CH2 is located downstream of the gate droplet applying apparatus 20G. The second monitoring apparatus CH2 monitors whether or not the metal ink MI has been applied onto the gate bus line GBL and is functioning as a conductive line. This second monitoring apparatus CH2 is formed by a camera which is formed by a one-dimensional CCD or a two-dimensional CCD. A second alignment camera CA2 is located downstream of the second monitoring apparatus CH2.

Next, an insulating layer droplet applying apparatus 20I receives position information from the second alignment camera CA2, and applies an electrical insulating ink which is formed from a polyimide based resin or urethane based resin onto switching portions. The electrical insulating ink is then dried and cured using warm air or radiant heat such as far infrared rays by the heat processing apparatus BK. The gate insulating layer I is formed as a result of this processing.

A third monitoring apparatus CH3 is located downstream of the insulating layer droplet applying apparatus 20I. The third monitoring apparatus CH3 monitors whether or not the electrical insulating ink has been applied onto the correct positions. This third monitoring apparatus CH3 is also formed by a camera which is formed by a one-dimensional CCD or a two-dimensional CCD. A third alignment camera CA3 is located downstream of the third monitoring apparatus CH3.

Next, the droplet applying apparatus 20SD for source, drain, and pixel electrodes (source, drain, and pixel electrodes droplet applying apparatus 20SD) receives position information from the third alignment camera CA3, and applies the metal ink MI inside the partition walls BA of a source bus line SBL and inside the partition walls BA of the pixel electrodes P. The metal ink MI is then dried or baked by the heat processing apparatus BK. An electrode in which a source electrode S, a drain electrode D, and a pixel electrode P are connected is formed as a result of this processing.

A fourth monitoring apparatus CH4 is located downstream of the droplet applying apparatus 20SD for source, drain, and pixel electrodes. The fourth monitoring apparatus CH4 monitors whether or not the metal ink MI has been applied in the correct positions. This fourth monitoring apparatus CH4 is also formed by a camera which is formed by a one-dimensional CCD or a two-dimensional CCD. A fourth alignment camera CA4 is located downstream of the fourth monitoring apparatus CH4.

Next, a cutting apparatus 30 receives position information from the fourth alignment camera CA4 and cuts the source electrodes S and drain electrodes D which are mutually connected. A femtosecond laser is preferably used as the cutting apparatus 30. An irradiation portion of the femtosecond laser which uses a titanium sapphire laser irradiates laser light LL having a wavelength of 760 nm in pulses of 10 kHz through 40 kHz while oscillating it to the left and right and up and down.

Because the cutting apparatus 30 uses a femtosecond laser, a processing in a sub micron order is possible, and the cutting apparatus 30 can accurately cut the spaces between the source electrodes S and drain electrodes D which determine the performance of a field effect transistor. The spaces between the source electrodes S and drain electrodes D are between approximately 20 µm and 30 µm. As a result of this cutting processing, electrodes in which the source electrodes S and drain electrodes D are separated are formed. In addition to a femtosecond laser, it is also possible to use a carbon gas laser or a green laser or the like. Moreover, it is also possible to perform the cutting mechanically using a dicing saw or the like other than the laser.

A fifth monitoring apparatus CH5 is located downstream of the cutting apparatus 30. The fifth monitoring apparatus CH5 monitors whether or not spaces have been accurately formed between the source electrodes S and the drain electrodes D. This fifth monitoring apparatus CH5 is also formed by a camera which is formed by a one-dimensional CCD or a two-dimensional CCD. A fifth alignment camera CA5 is located downstream from the fifth monitoring apparatus CH5.

Next, an organic semiconductor droplet applying apparatus 20OS receives position information from the fifth alignment camera CA5, and applies organic semiconductor ink in switching portions between the source electrodes S and the drain electrodes D. The organic semiconductor ink is then dried or baked using warm air or radiant heat such as far infrared rays or the like by the heat processing apparatus BK. The organic semiconductor layer OS is formed as a result of this processing.

Note that the compounds used to form the organic semiconductor ink may be monocrystalline materials or amorphous materials, and may be either low molecular or high molecular compound. Particularly preferable examples include single crystals or π-conjugated high molecules of annelated aromatic hydrocarbon compounds typified by pentacene, triphenylene, anthracene, and the like.

A sixth monitoring apparatus CH6 is located downstream of the organic semiconductor droplet applying apparatus 20OS. The sixth monitoring apparatus CH6 monitors whether or not the organic semiconductor ink has been applied in the correct positions. This sixth monitoring apparatus CH6 is also formed by a camera which is formed by a one-dimensional CCD or a two-dimensional CCD. A sixth alignment camera CA6 is located downstream of the sixth monitoring apparatus CH6.

[Light Emitting Layer Formation Process]

The manufacturing apparatus 100 of organic EL element next performs a process to form a light emitting layer IR of the organic EL element on the pixel electrode P.

In this light emitting layer formation process, the droplet applying apparatus 20 is used. As is described above, either an inkjet method or a dispenser method can be employed. Moreover, although not described in detail in the present embodiment, it is also possible to form the light emitting layer using a printing roller.

The light emitting layer IR contains a host compound and a phosphorescent compound (also known as a phosphorescent light emitting compound). The host compound is the compound which is contained in the light emitting layer. The phosphorescent compound is a compound in which the light emission from excited triplets can be observed, and emits phosphorescent light at room temperature.

A droplet applying apparatus 20Re for a red light emitting layer receives position information from the sixth alignment camera CA6 and applies R solution onto the pixel electrode P so as to form a film whose thickness after drying is approximately 100 nm. The R solution is a solution obtained by dissolving the polyvinylcarbazole (PVK) host material and a red dopant material in 1,2-dichloroethane.

Next, a droplet applying apparatus 20Gr for a green light emitting layer receives position information from the sixth alignment camera CA6 and applies G solution onto the pixel electrode P. The G solution is a solution obtained by dissolving the PVK host material and a green dopant material in 1,2-dichloroethane.

Furthermore, a droplet applying apparatus 20BL for a blue light emitting layer receives position information from the sixth alignment camera CA6 and applies B solution onto the pixel electrode P. The B solution is a solution obtained by dissolving the PVK host material and a blue dopant material in 1,2-dichloroethane.

Thereafter, the light emitting layer solutions are dried and cured using warm air or radiant heat such as far infrared rays or the like by the heat processing apparatus BK.

A seventh monitoring apparatus CH7 is located downstream of the light emitting layer formation process. The seventh monitoring apparatus CH7 monitors whether or not the light emitting layers have been properly formed. A seventh alignment camera CA7 is located downstream of the seventh monitoring apparatus CH7.

Next, an insulating layer droplet applying apparatus 20I receives position information from the seventh alignment camera CA7, and applies an electrical insulating ink formed from a polyimide based resin or a urethane based resin on a portion of the gate bus line GBL or source bus line SBL such that there is no short-circuiting between these and a transparent electrode ITO (described below). The electrical insulating ink is then dried and cured using warm air or radiant heat such as far infrared rays by the heat processing apparatus BK.

An eighth monitoring apparatus CH8 is located downstream of the insulating layer droplet applying apparatus 20I. The eighth monitoring apparatus CH8 monitors whether or not the electrical insulating ink has been applied. An eighth alignment camera CA8 is located downstream of the eighth monitoring apparatus CH8.

Next, an ITO electrode droplet applying apparatus 20IT receives position information from the eighth alignment camera CA8, and applies an ITO (indium tin oxide) ink on top of the red, green, and blue light emitting layers. The ITO ink is a compound which is formed by adding several percent of tin oxide ($SnO_2$) to indium oxide ($In_2O_3$), and the resulting electrode is transparent. It is also possible to use an amorphous material such as IDIXO ($In_2O_3$—ZnO) which can manufacture a transparent conductive film. The transparent conductive film preferably has a transmittance of 90% or more. The ITO ink is then dried and cured using warm air or radiant heat such as far infrared rays or the like by the heat processing apparatus BK.

A ninth monitoring apparatus CH9 is located downstream of the ITO electrode droplet applying apparatus 20IT. The ninth monitoring apparatus CH9 monitors whether or not the electrical insulating ink has been applied.

Note that there also are cases when the organic EL element 50 is provided with a positive hole transporting layer and an electron transporting layer, and printing technology or droplet applying technology may also be applied when forming these layers.

The manufacturing apparatus 100 of organic EL element has a main control unit 90. Signals monitored by the first monitoring apparatus CH1 through the ninth monitoring apparatus CH9 and alignment signals in the first alignment camera CA1 through the eighth alignment camera CA8 are sent to the main control unit 90. The main control unit 90 also controls the speeds of the supply roll RL and the rollers RR.

[[Alignment Mark and Counter Mark Formation]]

As a result of passing over the heat transfer roller 15 and the heat processing apparatuses BK, the sheet substrate FB expands and contracts in the X-axial direction and the Y-axial direction. Because of this, in the manufacturing apparatus 100 of organic EL element, the first alignment camera CA1 is located downstream of the heat transfer roller 15, and the second through eighth alignment cameras CA2 through CA8 are located after the heat processing apparatuses BK. Moreover, even when imprint defects or applying defects occur and these defective portions are identified and either removed or repaired, it is still necessary in such cases for these defective portions to be identified. Because of this, in the present embodiment, the first marks AM are also used as counter marks to verify the position in the X-axial direction.

[[First Marks AM and Second Marks BM]]

Using FIG. 2A as a typical example thereof, the control performed in the electrode formation process of the manufacturing apparatus 100 of organic EL element will now be described.

In FIG. 2A (a), the sheet substrate FB has at least one first mark AM in both sides of the sheet substrate FB respectively for the partition walls BA for the pixels and the partition walls BA for the wiring of the thin-film transistors which are lined up in the Y-axial direction which is the width direction of the sheet substrate FB. Moreover, one second mark BM, for example, for every 50 first marks AM is formed adjacent to the first marks AM. Because the sheet substrate FB is extremely long at, for example, 200 meters, the second marks BM are provided in order to make it easy to confirm at fixed intervals the row number of the row of thin-film transistor wiring partition walls BA and pixel partition walls BA. A pair of first alignment camera CA1 takes images of the first marks AM and the second marks BM, and sends the image results to the main control unit 90.

The fine imprint mold 11 stipulates the positional relationships between the first marks AM and second marks BM and the gate bus lines GBL and source bus lines SBL of the field effect transistors. Namely, as is shown in FIG. 2A (b), a predetermined distance AY between the first marks AM and the gate bus lines GBL and a predetermined distance BY between the second marks BM and the source bus lines SBL are stipulated in the Y-axial direction, and a predetermined distance AX between the first marks AM and second marks BM and the source bus lines SBL is stipulated in the X-axial direction.

Accordingly, by taking images of the pair of first marks AM, any shift in the X-axial direction, any shift in the Y-axial direction, and any 9 rotation is detected by the main control unit 90. Moreover, it is also possible to provide the first marks AM not only at both sides of the sheet substrate FB but also in a center area thereof.

The first alignment camera CA1 constantly monitors the sheet substrate FB which is being fed in the X-axial direction, and sends images of the first marks AM to the main control unit 90. The main control unit 90 is provided with an internal position counter 95, and the position counter 95 counts the row number in the Y-axial direction of the organic EL elements 50 from among all the organic EL elements 50 which are formed on the sheet substrate FB. In the main control unit 90, because the rotation of the rollers RR is controlled, it is possible to ascertain the row number of the organic EL element 50 which has been fed to the position of the gate droplet applying apparatus 20G or to ascertain the row number of the organic EL element 50 which has been fed to the position of the second monitoring apparatus CH2.

The position counter 95 confirms whether or not there are any errors in the counting of the row numbers by the first marks AM based on the images of the second marks BM which is sent from the first alignment camera CA1. For example, it is possible to prevent it not being possible to accurately ascertain the row number when there are defects in the locations of the first marks AM on the fine imprint mold 11.

The gate droplet applying apparatus 20G is located in the Y-axial direction, and a plurality of rows (multirow) of nozzles 22 are arranged in the Y-axial direction with a plurality of rows of nozzles 22 being arranged in the X-axial direction. The gate droplet applying apparatus 20G switches the timing at which the metal ink MI is applied from the nozzles 22 and also switches the nozzles 22 which are applying the metal ink MI in accordance with position signals from the main control unit 90 that are based on the first alignment camera CA1.

A heat processing apparatus BK is located downstream of the gate droplet applying apparatus 20G, and this heat processing apparatus BK dries the metal ink MI which has been applied by the gate droplet applying apparatus 20G. The second monitoring apparatus CH2 is located downstream of this heat processing apparatus BK.

The second monitoring apparatus CH2 sends monitored image signals to the main control unit 90, and a comparison is made in the main control unit 90 between those areas which were supposed to be applied with the metal ink MI by the gate droplet applying apparatus 20G and the monitored image signals. As a result of this, any defective portions in the applying of the metal ink MI are identified. The position in the organic EL element 50 and the row number of the organic EL element 50 where a defective portion occurred, or alternatively how many millimeters was the defective portion from the first marks AM are identified in the Y-axial direction by image processing. The row number of the organic EL element 50 where a defective portion occurred in the X-axial direction is identified based on the position counter 95, and the position in the organic EL element 50 of that row is also identified.

[[First Marks AM and Third Marks CM]]

Figure 2B:
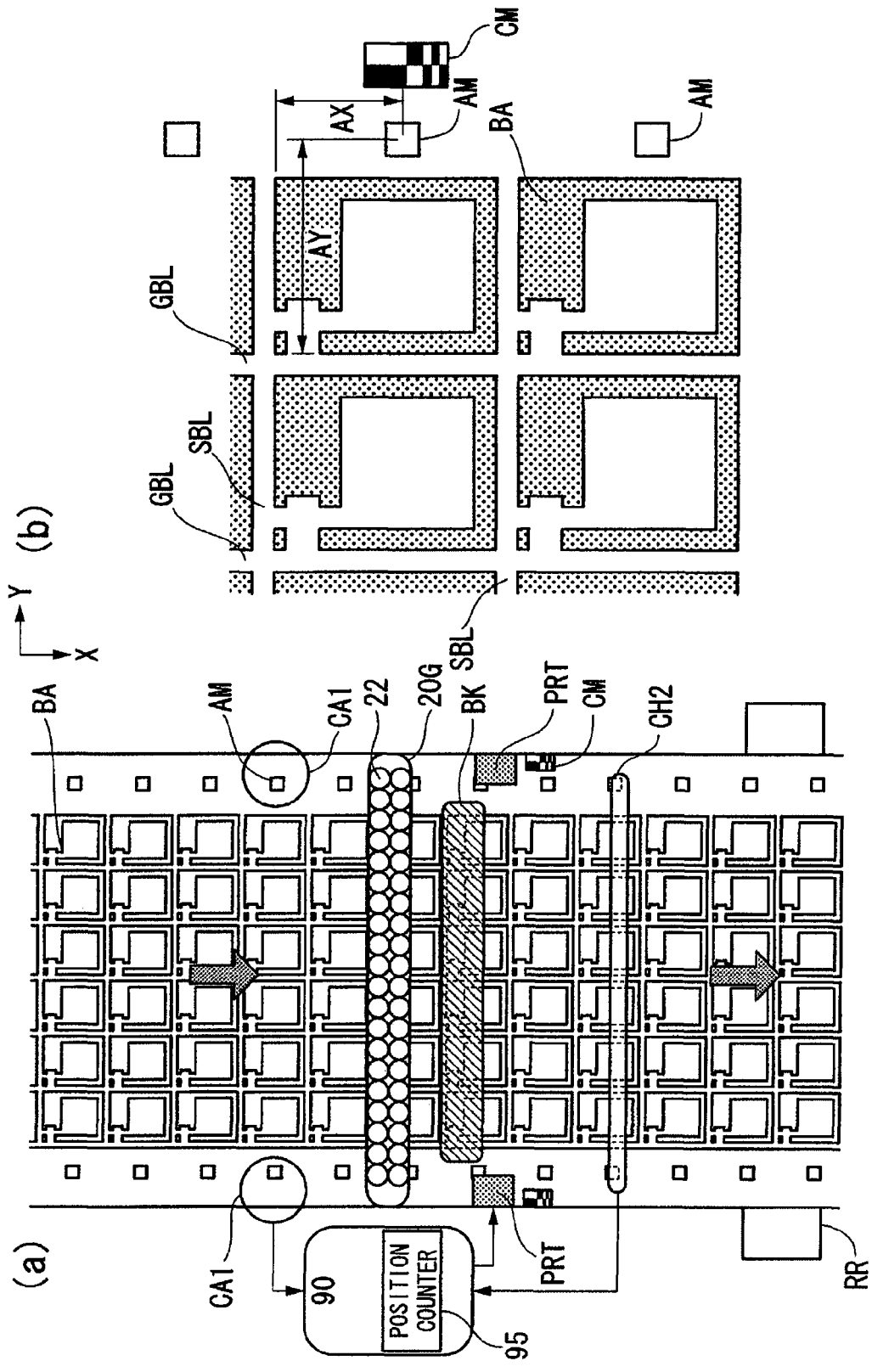
FIG. 2B is a conceptual view in which first marks AM and third marks CM are monitored in an electrode formation process of the organic EL manufacturing apparatus 100.

FIG. 2B shows an example in which third marks CM are formed instead of the second marks BM. The same symbols are used for portions which are the same as portions described in FIG. 2A. Those portions that are different from FIG. 2A are described below.

In FIG. 2B (a), the sheet substrate FB has third marks CM instead of the second marks BM. In addition, one third mark CM is formed, for example, for 50 of the first marks AM. Because the sheet substrate FB is extremely long at, for example, 200 meters, the third marks CM are provided in order to make it easy to confirm at fixed intervals the row number of the row of thin-film transistor wiring partition walls BA and pixel partition walls BA. A pair of first alignment camera CA1 takes images of the first marks AM and the third marks CM, and sends the image results to the main control unit 90.

The fine imprint mold 11 does not have a stamper for the third marks CM. Instead, there is provided a printing apparatus PRT which is connected to the main control unit 90. This printing apparatus PRT prints third marks CM which show a specific address such as a barcode or number or the like. The first alignment camera CA1 sends images of the first marks AM to the main control unit 90, the position counter 95 counts the row number in the Y-axial direction of the organic EL elements 50 from among all the organic EL elements 50 which are formed on the sheet substrate FB. The main control unit 90 causes the printing apparatus PRT to print third marks CM which indicate addresses such as the 150th row, the 250th row, and the like. Because the third marks CM show specific addresses, an operator is also able to ascertain the address visually. The third marks CM can also be used to specify addresses in the repair process (described below).

Note that in FIG. 2A and FIG. 2B, the shape of the first marks AM is shown as a square shape. However, they may also be other shapes such as circular marks or diagonal straight-line marks or the like. Moreover, the printing apparatus PRT shown in FIG. 2B may be a thermal sublimation type or inkjet type printer, and any type of printing method can be used. Moreover, in addition to the first marks AM and second marks BM shown in FIG. 2A, it is also possible for the third marks shown in FIG. 2B to be formed.

[[Fourth Marks DM and Fifth Marks EM]]

Figure 2C:
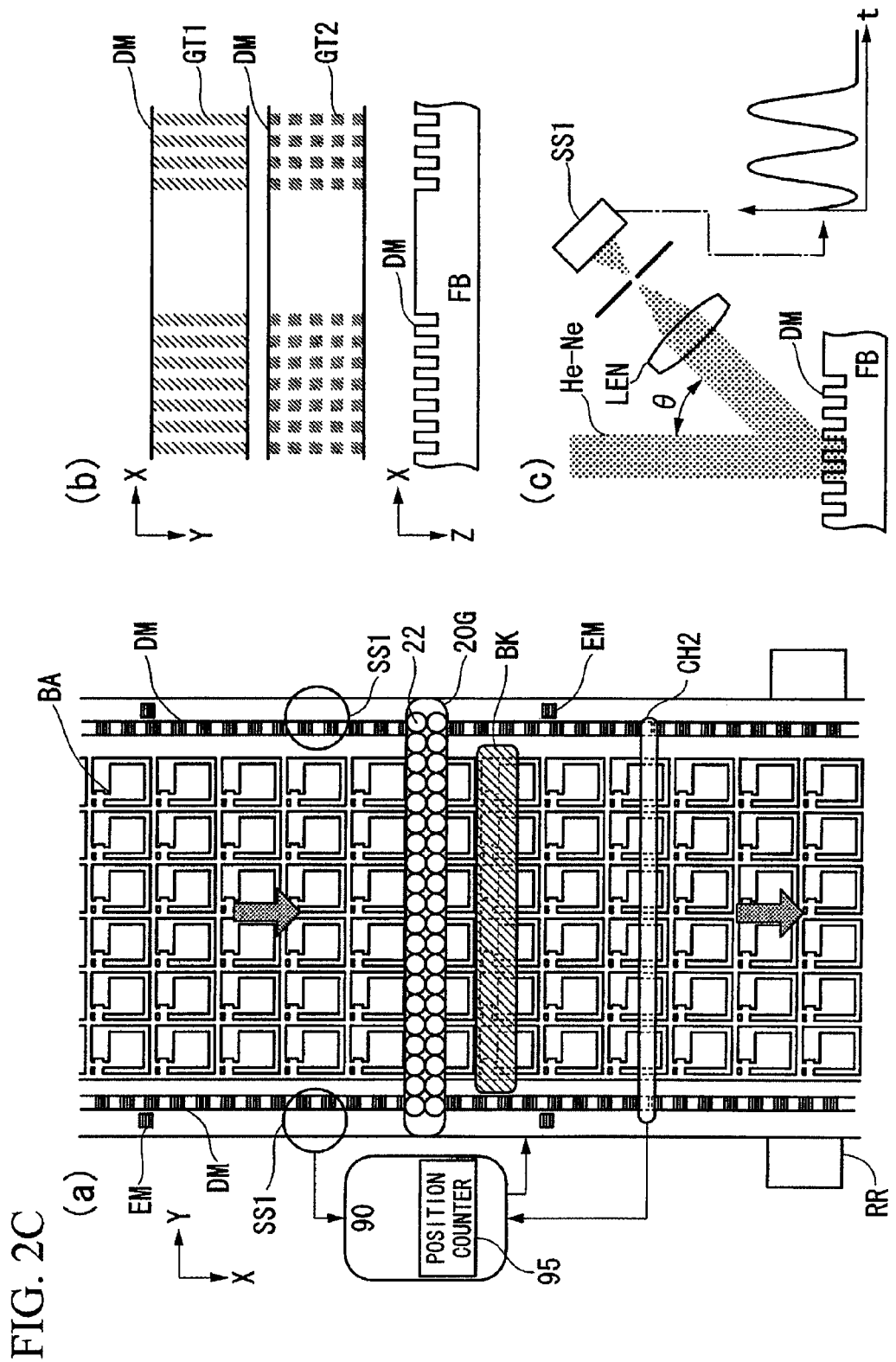
FIG. 2C is a conceptual view in which fourth marks DM and fifth marks EM of a diffraction grating are monitored.

FIG. 2C shows an example in which, compared with FIG. 2A, fourth marks DM are formed instead of the first marks AM, and fifth marks EM are formed instead of the second marks BM. The same symbols are used for portions which are the same as portions described in FIG. 2A. Those portions that are different from FIG. 2A are described below.

In FIG. 2C (a), the sheet substrate FB has the fourth marks DM instead of the first marks AM, and has the fifth marks EM instead of the second marks BM. Diffraction gratings GT are formed in the fourth marks DM and the fifth marks EM. Because of this, the manufacturing apparatus 100 of organic EL element is provided with a grating detector SS1 which detects signal intensity. The grating detector SS1 constantly monitors the sheet substrate FB which is being fed in the X-axial direction, and sends intensity signals of the fourth marks DM and fifth marks EM to the main control unit 90. In addition, one fifth mark DM is formed, for example, for 50 of the fourth marks DM. Because the sheet substrate FB is extremely long at, for example, 200 meters, the fifth marks CM are provided in order to make it easy to confirm at fixed intervals the row number of the row of thin-film transistor wiring partition walls BA and pixel partition walls BA.

The fourth marks DM are shown in FIG. 2C (b). The fourth marks DM may be a horizontal stripe diffraction grating GT1 which extends in the Y-axial direction as is shown in the upper portion in FIG. 2C (b), or may be a dot pattern diffraction grating GT2 which is arrayed in the X-axial direction and the Y-axial direction as is shown in the intermediate portion in FIG. 2C (b). Cross-sections of the horizontal stripe diffraction gratings GT1 and the dot pattern diffraction gratings GT2 have the configuration shown in the bottom portion in FIG. 2C (b). The horizontal stripe diffraction gratings GT1 and the dot pattern diffraction gratings GT2 are formed by the fine imprint mold 11 at the same time as the pixel partition walls BA and wiring partition walls BA of the thin-film transistor. Note that, although omitted from the drawings, the fifth marks EM have the same diffraction gratings GT as the fourth marks DM.

FIG. 2C (c) shows a grating detector SS1 which detects the fourth marks DM and fifth marks EM. In order to detect the fourth marks DM or fifth marks EM, coherent light such as He—Ne laser light ($\lambda$=0.6328 µm) is irradiated onto these fourth marks DM or fifth marks EM. In addition, a ±n order image (n=1, 2, . . . ) is detected via a lens LEN from the horizontal stripe pattern diffraction grating GT1 and dot pattern diffraction grating GT2.

If the intervals between these horizontal stripe diffraction gratings GT1 and dot pattern diffraction gratings GT2, namely, the lattice constant is taken as L, the wavelength of the coherent light is taken as X, and if the angle between the coherent light irradiation angle (irradiation direction) and the alignment direction of the grating detector SS1 is taken as $\theta$, then a relationship whereby $L \sin \theta = n \lambda$ (n=±1, ±2, . . . ) is established.

As is shown in the graph in FIG. 2C (c), in locations where both a horizontal stripe diffraction grating GT1 and a dot pattern diffraction grating GT2 are present, the grating detector SS1 detects a waveform-shaped signal, and detects no signal from locations where there is no diffraction grating. Because of this, the position counter 95 digitalizes the detected signals, and counts the row number in the Y-axial direction of the organic EL element 50 from among all the organic EL elements 50 which are formed on the sheet substrate FB. Accordingly, it is possible to quickly and accurately ascertain the position of an organic EL element 50. Moreover, because the fourth marks DM and fifth marks EM are diffraction gratings, they are not easily affected by dirt and the like.

Note that if the dot pattern diffraction grating GT2 shown in FIG. 2C (b) is used, then by measuring the tilt and position in the Y-axial direction of the sheet substrate FB, or by measuring the fourth marks DM on both sides of the sheet substrate FB, it is possible to also measure the stretching in the Y-axial direction of the sheet substrate FB. Moreover, the first marks AM and second marks BM are used in the description given below. However, any marks from the first marks AM through the fifth marks EM can be applied in this way.

[[Organic EL Elements 50 formed in Partition Walls of a Field Effect Transistor]]

Figure 3:
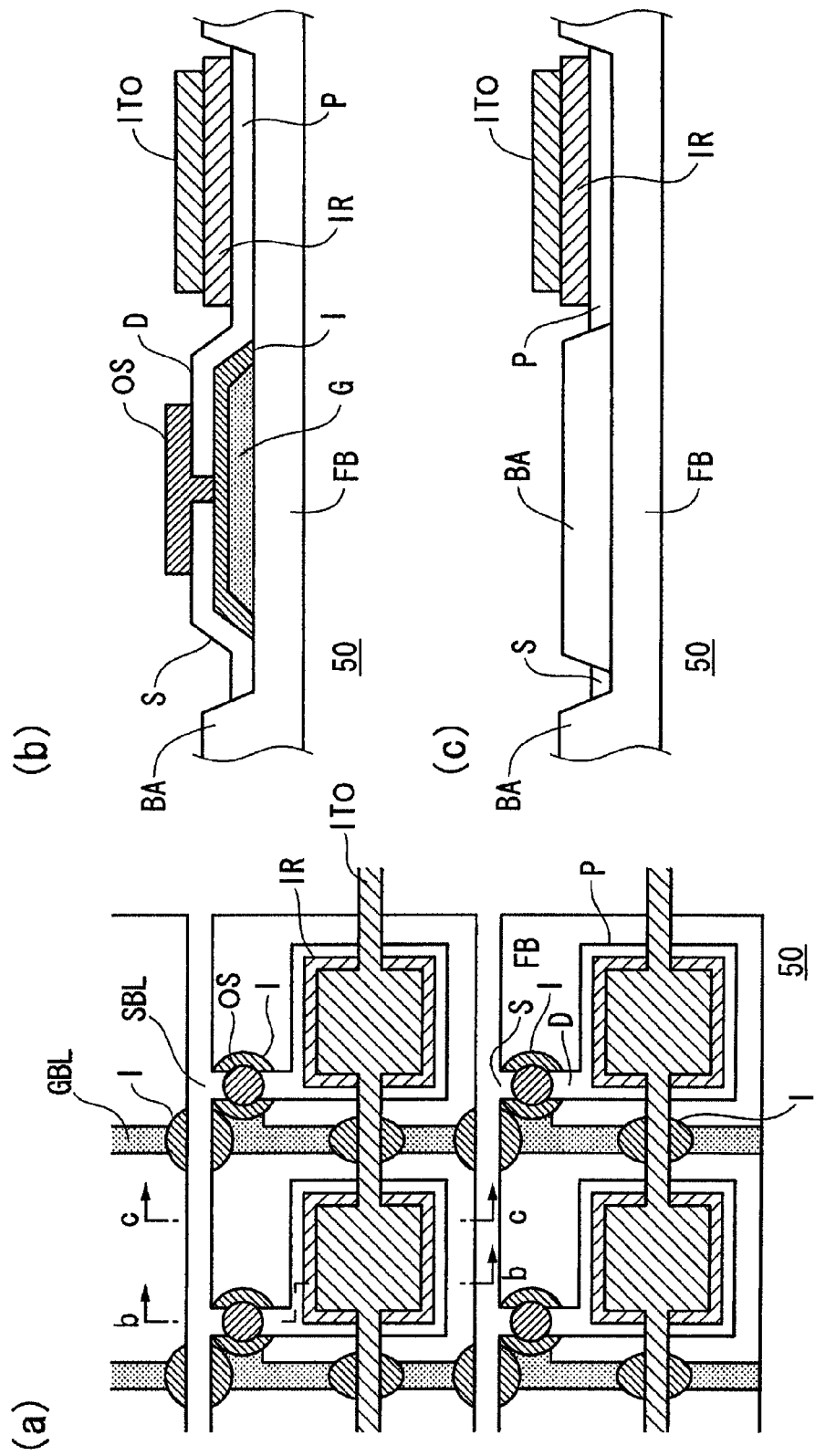
FIG. 3 is a view showing a state of a bottom contact type organic EL element in which a light emitting layer IR and an ITO electrode have been formed.

FIG. 3 shows a state of a bottom contact type organic EL element on which a light emitting layer IR and an ITO electrode have been formed. The organic EL element 50 has a gate electrode G, a gate insulating layer I, and the pixel electrode P which are formed on the sheet substrate FB, and the organic semiconductor layer OS, the light emitting layer IR, and the ITO electrode are further formed thereon.

In FIG. 3, the sheet substrate FB is formed by a heat resistant resin film. Specifically, polyethylene resins, polypropylene resins, polyester resins, ethylene-vinyl copolymer resins, polyvinyl chloride resins, cellulose resins, polyamide resins, polyimide resins, polycarbonate resins, polystyrene resins, vinyl acetate resins and the like can be used for the sheet substrate FB.

As has been described above, because the sheet substrate FB undergoes heat processing via heat transfer in the partition wall forming process, and the various types of ink must be dried or baked by the heat processing apparatuses BK, the sheet substrate FB is heated to approximately 200 degrees. The sheet substrate FB preferably has a low coefficient of thermal expansion so that the dimensions thereof do not change when it is heated. For example, it is possible to lower the coefficient of thermal expansion by mixing an inorganic filler into the resin film. Examples of this inorganic filler include titanium oxide, zinc oxide, alumina, silicon oxide and the like.

As is shown in FIG. 3 (b) and FIG. 3 (c), because the partition walls BA are present, it is possible to form accurate and uniform electrodes and light emitting layers and the like. Because the sheet substrate FB is fed at high speed in the X-axial direction (i.e., the longitudinal direction) by the rollers RR, even in cases in which there is a possibility that the droplet applying apparatus 20 will not be able to accurately apply droplets, it is still possible to form accurate and uniform electrodes and light emitting layers and the like.

Note that the manufacturing apparatus 100 is able to manufacture various field effect transistors in addition to the field effect transistor shown in FIG. 3. For example, the manufacturing apparatus 100 is also able to manufacture top-gate type field effect transistors by switching the order in which the inks are applied onto the sheet substrate FB.

[Monitoring Apparatuses CH]

Hereinafter, a description will be given of the various monitoring apparatuses CH using FIG. 4 through FIG. 7.

Figure 4:
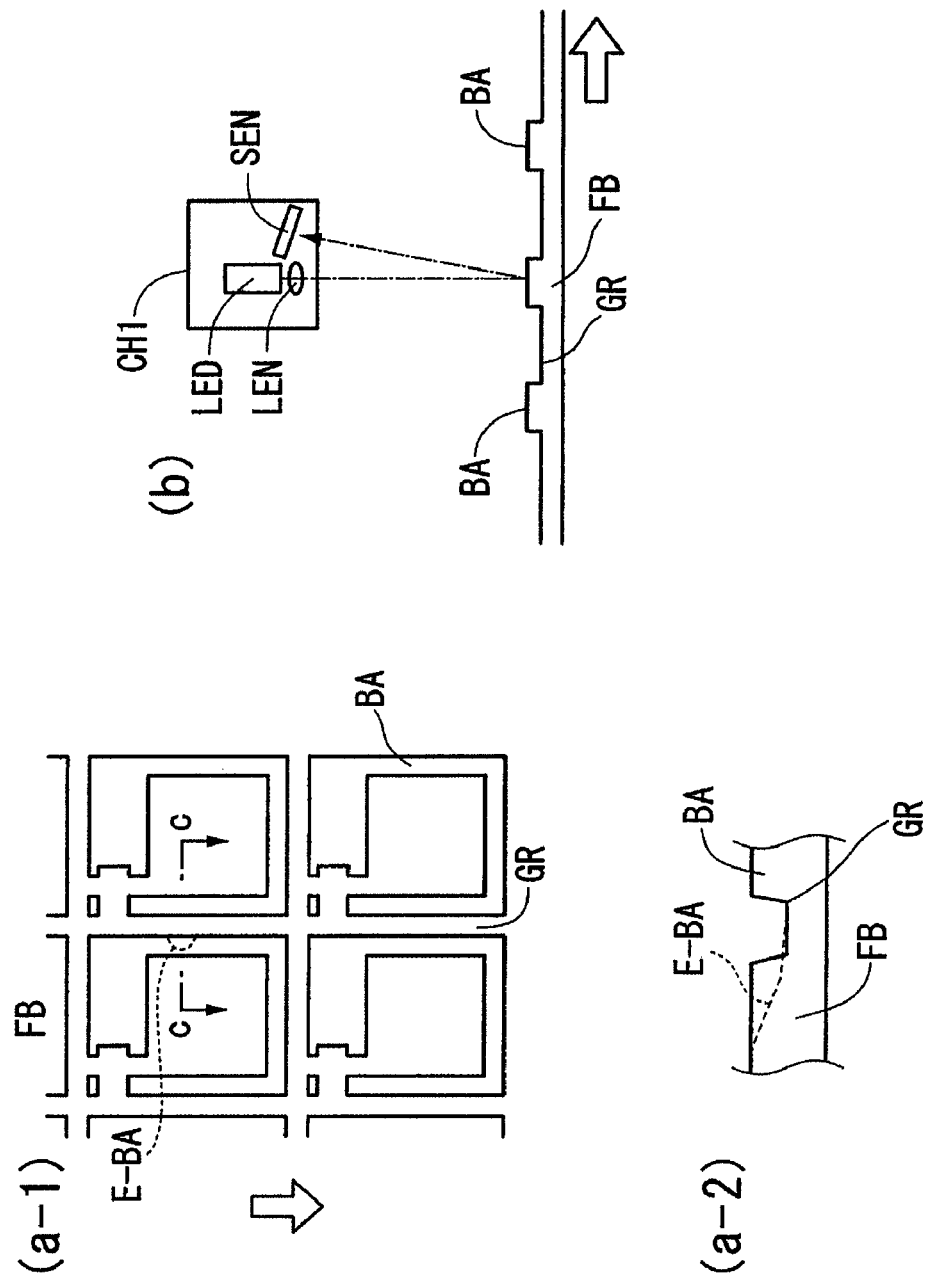
FIG. 4 is a view illustrating a first monitoring apparatus CH1 in a partition wall formation process.

FIG. 4 is a view illustrating the first monitoring apparatus CH1 in the partition wall forming process. FIG. 4 (a-1) is a top view of a sheet substrate FB which has been printed by the fine imprint mold 11. FIG. 4 (a-2) is a cross-sectional view taken along the line c-c in FIG. 4 (a-1), and FIG. 4 (b) is a conceptual view showing a partition wall BA being monitored by the first monitoring apparatus CH1.

The partition walls BA of the sheet substrate FB which are formed by the fine imprint mold 11 form the foundation of wiring and the like, and whether or not the partition walls BA are formed accurately is a vital factor for applying of the metal ink MI in a subsequent process. As is shown in FIG. 4 (a-2), conventionally, partition walls BA such as those shown by the solid lines should be formed, however, in some cases dirt adheres to the fine imprint mold 11 or to the sheet substrate FB, so that defective partition walls E-BA whose shape is incorrect have been formed. Because of this, groove portions GR where the metal ink MI is applied between partition walls BA have not been formed accurately.

The first monitoring apparatus CH1 shown in FIG. 4 (b) is, for example, a laser measuring instrument, and is formed from a laser light source LED, a lens LEN, and a sensor SEN. The laser light source LED is irradiated onto the sheet substrate FB, and reflected light therefrom is received by the sensor SEN, so that the height of the partition walls BA can be measured.

Figure 5:
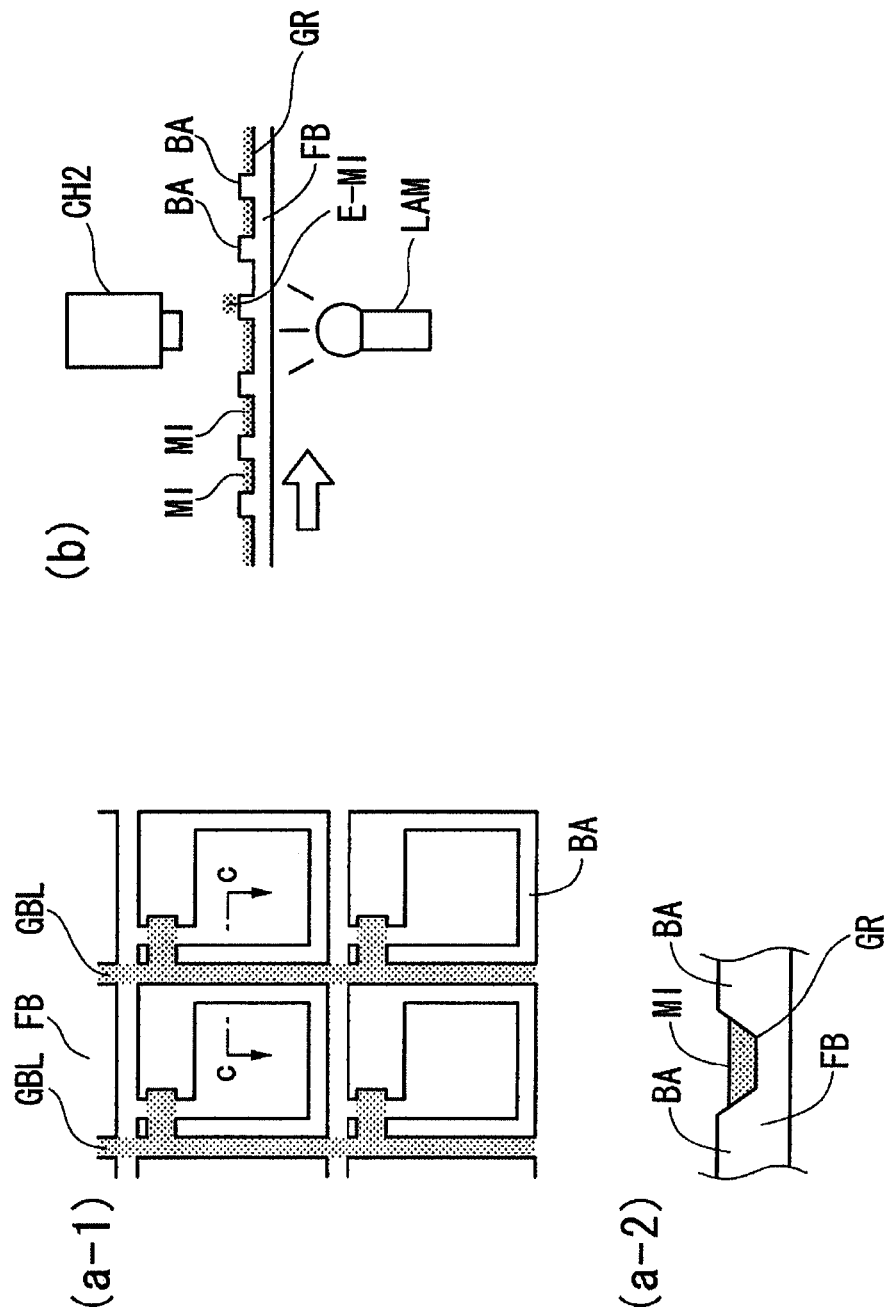
FIG. 5 is a view illustrating a second monitoring apparatus CH2 in an electrode formation process.

FIG. 5 is a view illustrating a second monitoring apparatus CH2 in the electrode formation process. FIG. 5 (a-1) is a top view of a sheet substrate FB which has completed the electrode formation process. FIG. 5 (a-2) is a cross-sectional view taken along the line c-c thereof, and FIG. 5 (b) is a conceptual view showing a gate bus line GBL being monitored by the second monitoring apparatus CH2.

Conventionally, as is shown in FIG. 5 (a-1), if the groove portions GR between partition walls BA for the gate bus lines GBL are accurately applied with the metal ink MI, and the metal ink MI is dried or baked by the heat processing apparatus BK, then the metal ink MI forms a thin film as is shown in FIG. 5 (2-a). However, there are instances, such as the metal ink MI is applied on top of the partition walls BA or is applied on different portions from those of the design, due to the malfunctioning of the nozzles 22 of the gate droplet applying apparatus 20G or the like.

The second monitoring apparatus CH2 shown in FIG. 5 (b) is formed by a one-dimensional or two-dimensional camera. The second monitoring apparatus CH2, for example, illuminates the bottom surface of the sheet substrate FB from underneath using a lamp LAM and monitors the transmitted light thereof. As is shown in FIG. 5 (b), it is able to monitor a state in which the metal ink MI is applied on top of a partition wall BA. Note that, because many sheet substrates FB are transparent, placing the lamp LAM beneath the bottom surface of the sheet substrate FB as far as the first half of the processes (i.e., the process in which monitoring is performed by the fourth monitoring apparatus CH4) makes monitoring easier than if reflection light is monitored.

Figure 6:
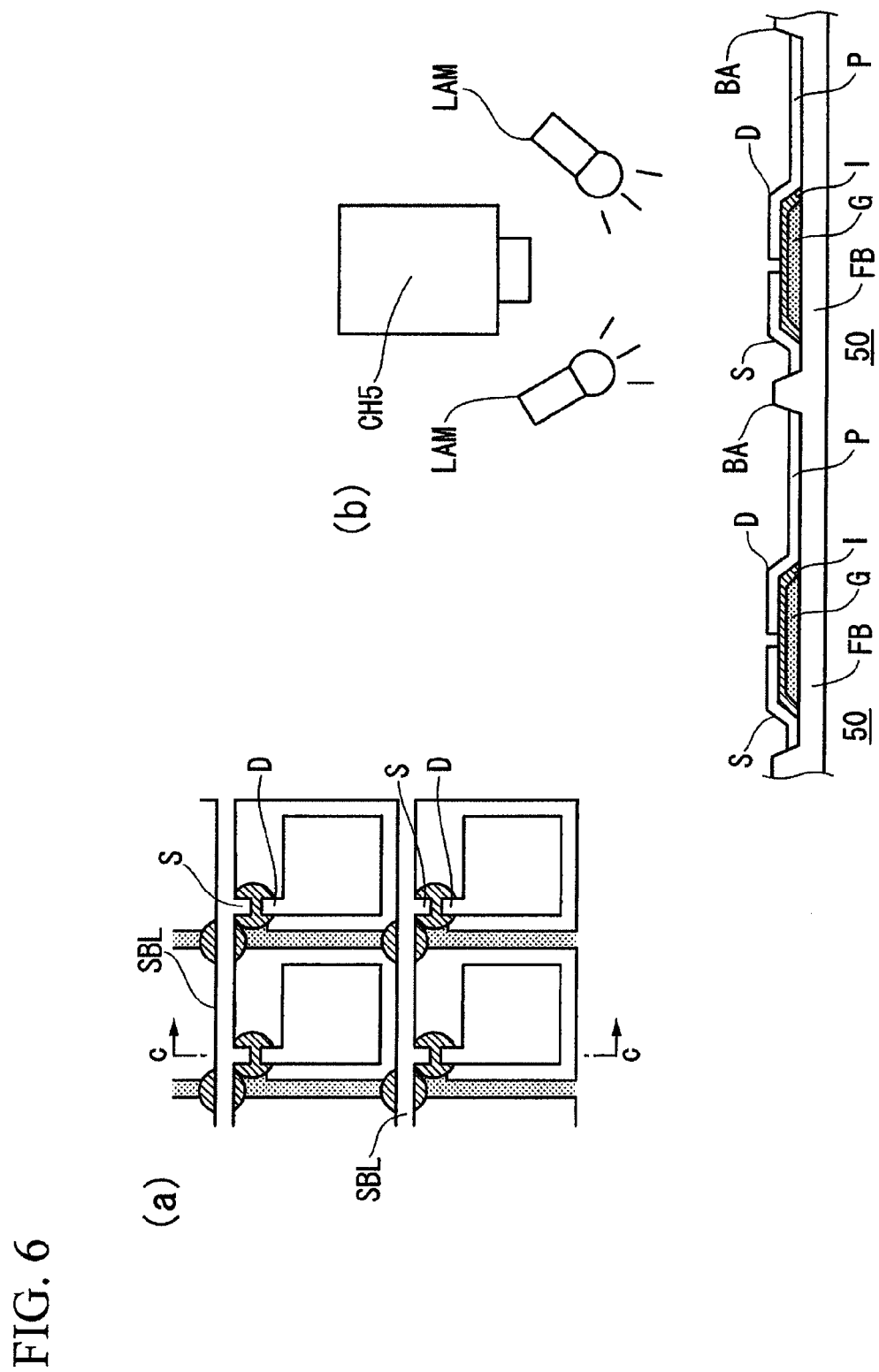
FIG. 6 is a view illustrating a fifth monitoring apparatus CH5 in a process of a cutting apparatus 30 that forms gaps between source electrodes S and drain electrodes D.

FIG. 6 is a view illustrating a fifth monitoring apparatus CH5 in the process performed by the cutting apparatus 30 which forms partitions between the source electrodes S and the drain electrodes D. FIG. 6 (a) is a top view of a sheet substrate FB which has completed the cutting process. FIG. 6 (b) is a conceptual view showing a cross-section across a line c-c thereof, and shows the cutting being monitored by the fifth monitoring apparatus CH5.

The gate electrodes G and the gate insulating layers I have already been formed around the source electrodes S and the drain electrodes D. Because of this, it is difficult for the fifth monitoring apparatus CH5 to monitor the spaces between the source electrodes S and the drain electrodes D by using transmitted light. Therefore, lamps LAM are placed around the fifth monitoring apparatus CH5 and the area around the source electrodes S and drain electrodes D is monitored.

[Identification of Repair Portions]

Figure 7A:
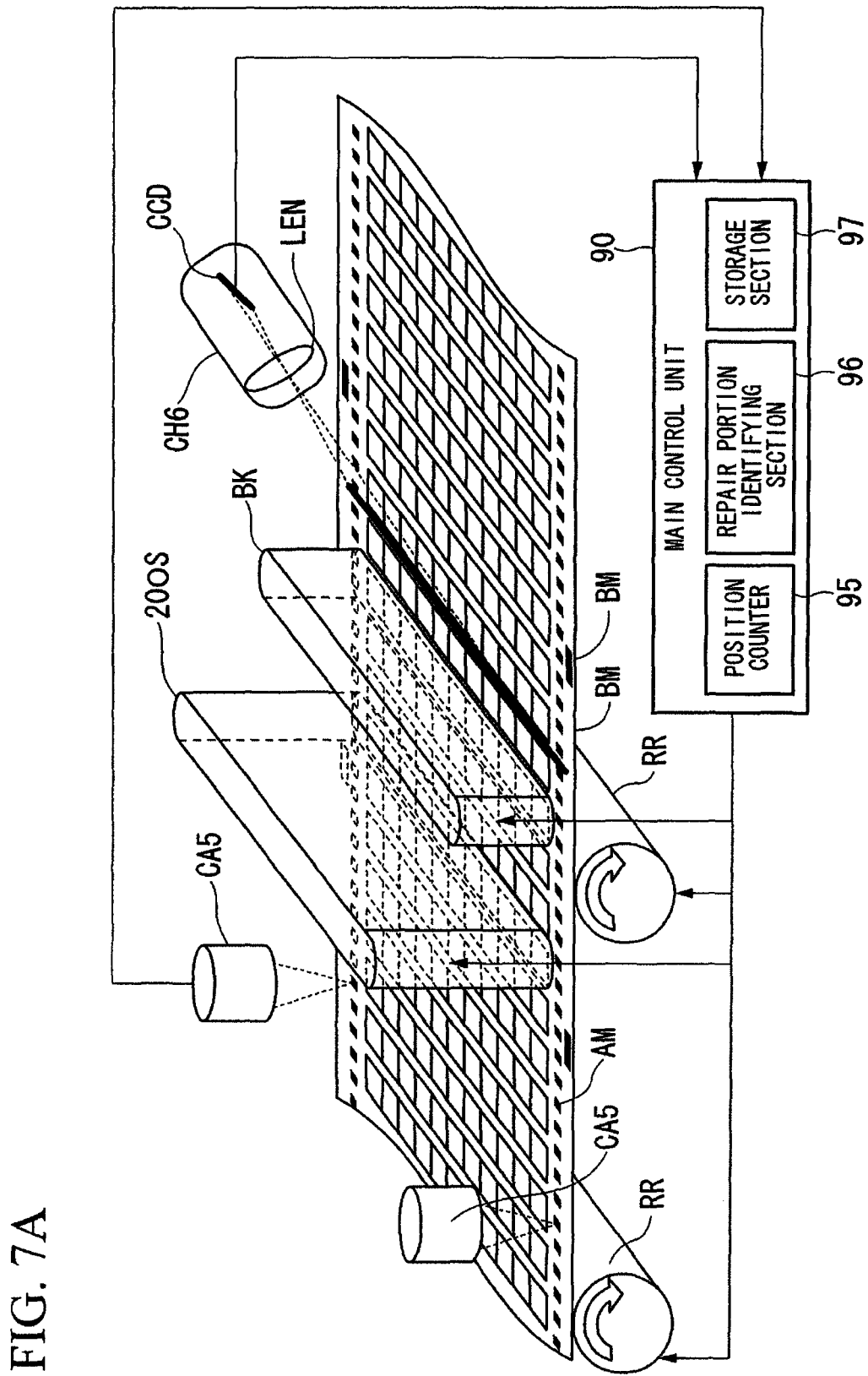
FIG. 7A is a perspective view showing a portion from a fifth alignment camera CA5 to a sixth monitoring apparatus CH6.

FIG. 7A is a perspective view showing a portion from the fifth alignment camera CA5 to the sixth monitoring apparatus CH6. The identification of repair portions is fundamentally the same in other processes as well, however, the organic semiconductor droplet applying apparatus 200S is described as a typical example thereof.

The fifth alignment camera CA5 is connected to the main control unit 90, and the fifth alignment camera CA5 sends image signals of the first marks AM to the main control unit 90. The main control unit 90 measures the tilt and the position in the Y-axial direction of the sheet substrate FB based on these image signals, and also measures the stretching of the sheet substrate FB in the Y-axial direction by measuring the first marks AM on both sides of the sheet substrate FB.

Because the main control unit 90 also controls the rotation of the rollers RR, it is also able to ascertain the movement speed of the sheet substrate FB in the X-axial direction, and, based on the first marks AM, outputs a signal to the organic semiconductor droplet applying apparatus 200S so that organic semiconductor ink is applied onto switching portions between the source electrode S and the drain electrode D of each organic EL element 50. The heat processing apparatus BK then dries or bakes the organic semiconductor ink using warm air or radiant heat such as far infrared rays or the like.

The main control unit 90 is internally provided with a position counter 95 which counts positions in the X-axial direction, a repair portion identifying section 96 which identifies defective portions, namely, repair portions which require repairing, and a storage section 97 in which the design dimensions of the organic EL element 50 and repair portions and the like are stored.

The sixth monitoring apparatus CH6 is internally provided with a lens LEN and a one-dimensional CCD, and image signals from this one-dimensional CCD are sent to the main control unit 90. The main control unit 90 is able to ascertain the state of the organic semiconductor ink applied by the organic semiconductor ink droplet applying apparatus 200S. The repair portion identifying section 96 compares design values stored in the storage unit 96, namely applying positions where the organic semiconductor ink should have been applied, with the actual positions of the organic semiconductor ink applied by the organic semiconductor droplet applying apparatus 200S, and identifies difference portions as being defective portions. The repair portion identifying section 96 is able to identify the distance ($\mu$m) of these defective portions from the first marks AM in the X-axial direction and the Y-axial direction, and is also able to identify which row of the organic EL element 50 belongs to by means of the count of the position control unit 95. Identified repair portions are stored in the storage section 97, and data for these repair portions is used in the repair process.

Figure 7B:
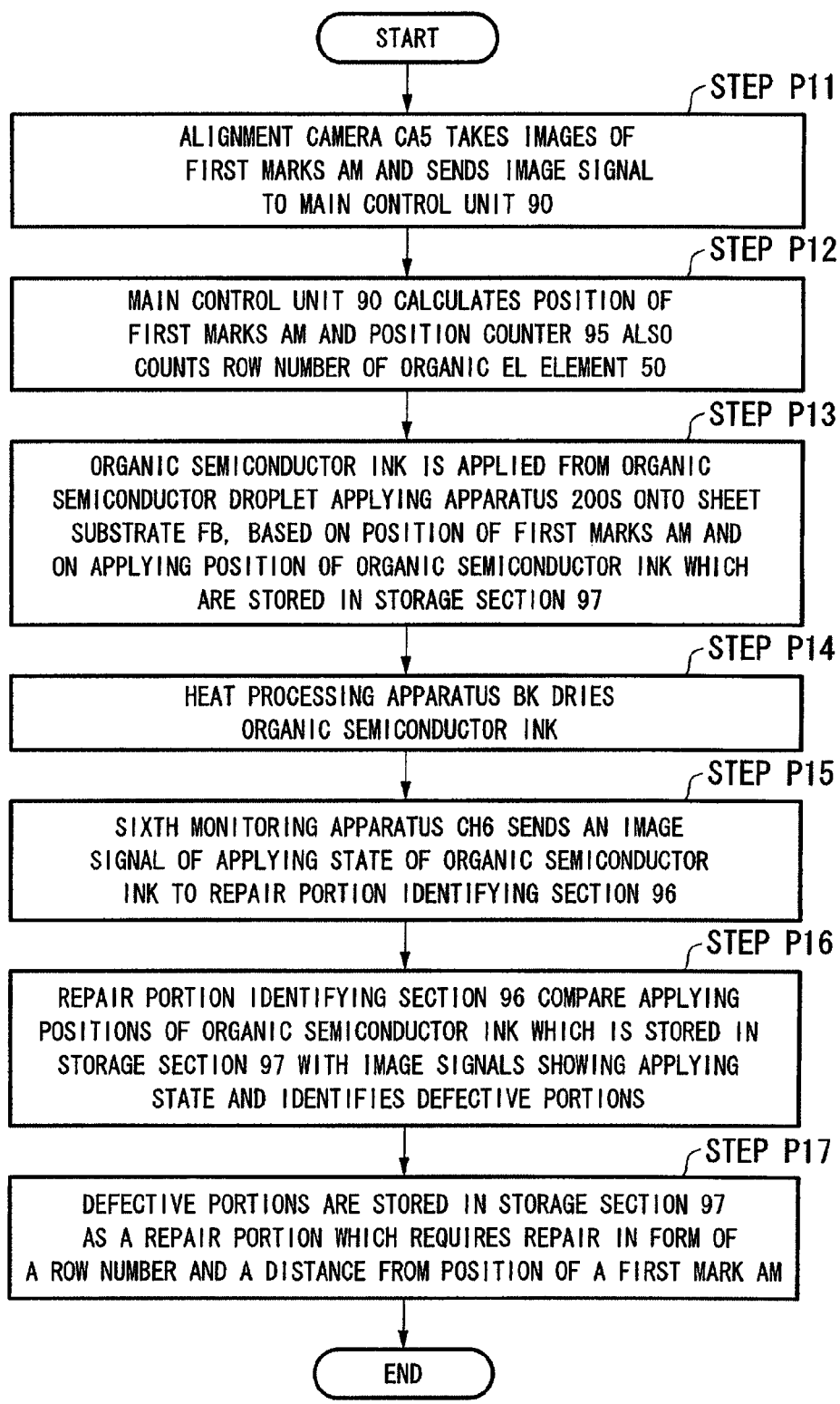
FIG. 7B is a flowchart for an applying process of an organic semiconductor ink and a process in which repair portions are stored in FIG. 7A.

FIG. 7B is a flowchart showing the applying processing of the semiconductor ink and the repair portion storage process of FIG. 7A.

In step P11, the alignment camera CA5 take images of the first marks AM and sends image signals to the main control unit 90.

In step P12, the main control unit 90 calculates the position of the first marks and the position counter 95 also counts the row number of the organic EL element 50. The first marks AM are used to determine the positions where the organic semiconductor droplet applying apparatus 200S applies the organic semiconductor ink, and are also used to identify the row number of the organic EL element 50. Note that it is also possible to identify the row number of the organic EL element 50 by taking images of the second marks BM and the third marks CM which were described using FIG. 2A and FIG. 2B using the alignment camera CA5.

In step P13, organic semiconductor ink is applied from the organic semiconductor droplet applying apparatus 200S onto the sheet substrate FB, based on the positions of the first marks AM and on the organic semiconductor ink applying positions which are stored in the storage section 97.

In step P14, the heat processing apparatus BK dries the organic semiconductor ink.

In step P15, the sixth monitoring apparatus CH6 sends an image signal of the applying state of the organic semiconductor ink to the repair portion identifying section 96. Because the sheet substrate FB moves in the X-axial direction, it is sufficient if the sixth monitoring apparatus CH6 is a one-dimensional CCD which extends in the Y-axial direction. If there is a lot of noise in the image signals of the organic semiconductor ink due to the fast movement speed of the sheet substrate FB, then it is possible to prepare a two-dimensional CCD to which is connected a frame accumulation-type memory which gradually shifts the accumulation location of the CCD to match the movement speed of the sheet substrate FB. This method is a type of CCD reading method which is generally known as a TDI (Time Delay Integration) method.

Next, in step P16, the repair portion identifying section 96 compares the applying positions of the organic semiconductor ink which is stored in the storage section 97 with the image signals showing the applying state, and identifies defective portions.

In step P17, the defective portions are stored in the storage section 97 as a repair portion which requires repair in the form of a row number and a distance from the position of a first mark AM.

[Organic EL Element Repair Apparatus]

Figure 8A:
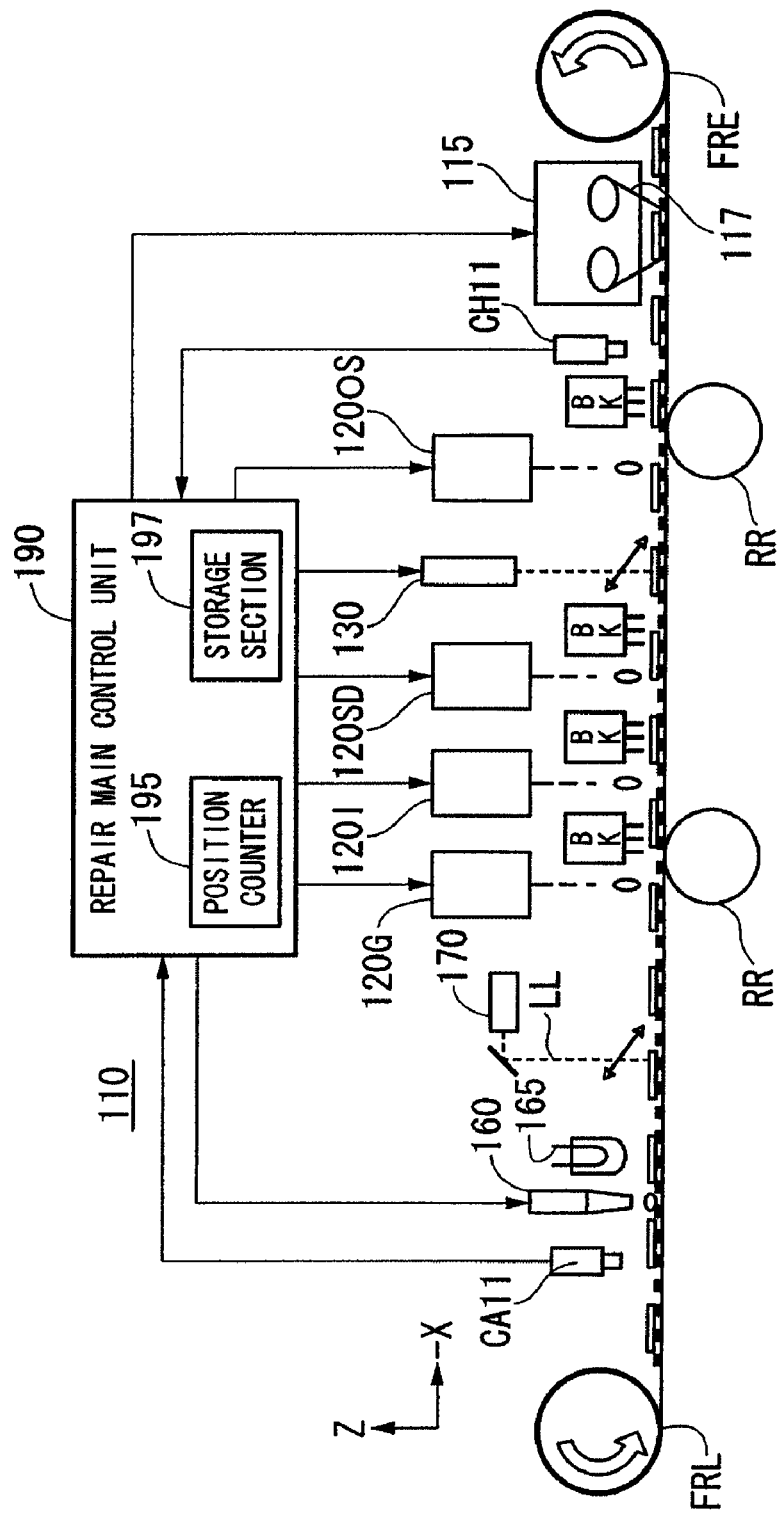
FIG. 8A is a schematic view showing a repair apparatus 110 that repairs organic EL elements 50 which have repair portions using batch processing.

FIG. 8A is a schematic view showing a repair apparatus 110 which repairs an organic EL element 50 in which a repair portion is present using batch processing. The repair apparatus 110 is controlled by a repair main control unit 190. The repair main control unit 190 has a repair position counter 195 and a repair storage section 197. These are fundamentally the same as the position counter 95 and storage section 97 of the manufacturing apparatus 100, however, repair portions identified by the repair portion identifying section 96 and stored in the storage section 97 of the manufacturing apparatus 100 are forwarded on to the repair storage unit 197.

The repair apparatus 110 of organic EL element is provided with a dispenser 160 for partition wall repair, a laser zapping apparatus 170, a repair droplet applying apparatus 120G for gates, a repair droplet applying apparatus 120I for insulating layers, a repair droplet applying apparatus 20SD for source, drain, and pixel electrodes, a repair cutting apparatus 130, a repair droplet applying apparatus 200S for organic semiconductors, and a remover 115. The repair droplet applying apparatus 120 and the repair cutting apparatus 130 are the same as the droplet applying apparatus 20 and cutting apparatus 30 of the manufacturing apparatus 100 and, therefore, a description thereof is omitted.

The partition wall repair dispenser 160 applies a high-viscosity UV curable resin HR. The UV curable resin HR is applied on to the sheet substrate FB via nozzles of the partition wall repair dispenser 160 by means of air pressure or the like. As a result, UV curable resin partition walls BA are formed. The partition walls BA of UV curable resin HR which are formed on the sheet substrate FB are cured by a UV lamp 165 such as a mercury lamp.

The UV curable resin HR is a resin whose main component is a resin which is cured when it undergoes a cross-linking reaction or the like by irradiating UV rays. Components which include a monomer having an ethylene unsaturated double bond are preferably used as the UV curable resin HR, and a UV cured resin layer is formed by curing the UV curable resin HR via the irradiation of UV rays. As the UV curable resin, it is possible to use, for example, UV curable urethane acrylate-based resin, UV curable polyester acrylate-based resin, UV curable epoxy acrylate-based resin, UV curable polyol acrylate-based resin, and UV curable epoxy resin and the like. Among these, UV curable acrylate-based reason is preferable. Note that if the resin is to be used to form the partition walls BA of a light emitting layer, because a black matrix is preferable, it is also possible to introduce a metal such as chrome, an oxide, and carbon and the like into the UV curable acrylate-based resin. Note also that it is also possible to use a heat curable resin instead of the UV curable resin HR. In this case, a heater is installed instead of the UV ray lamp 165.

Figure 8B:
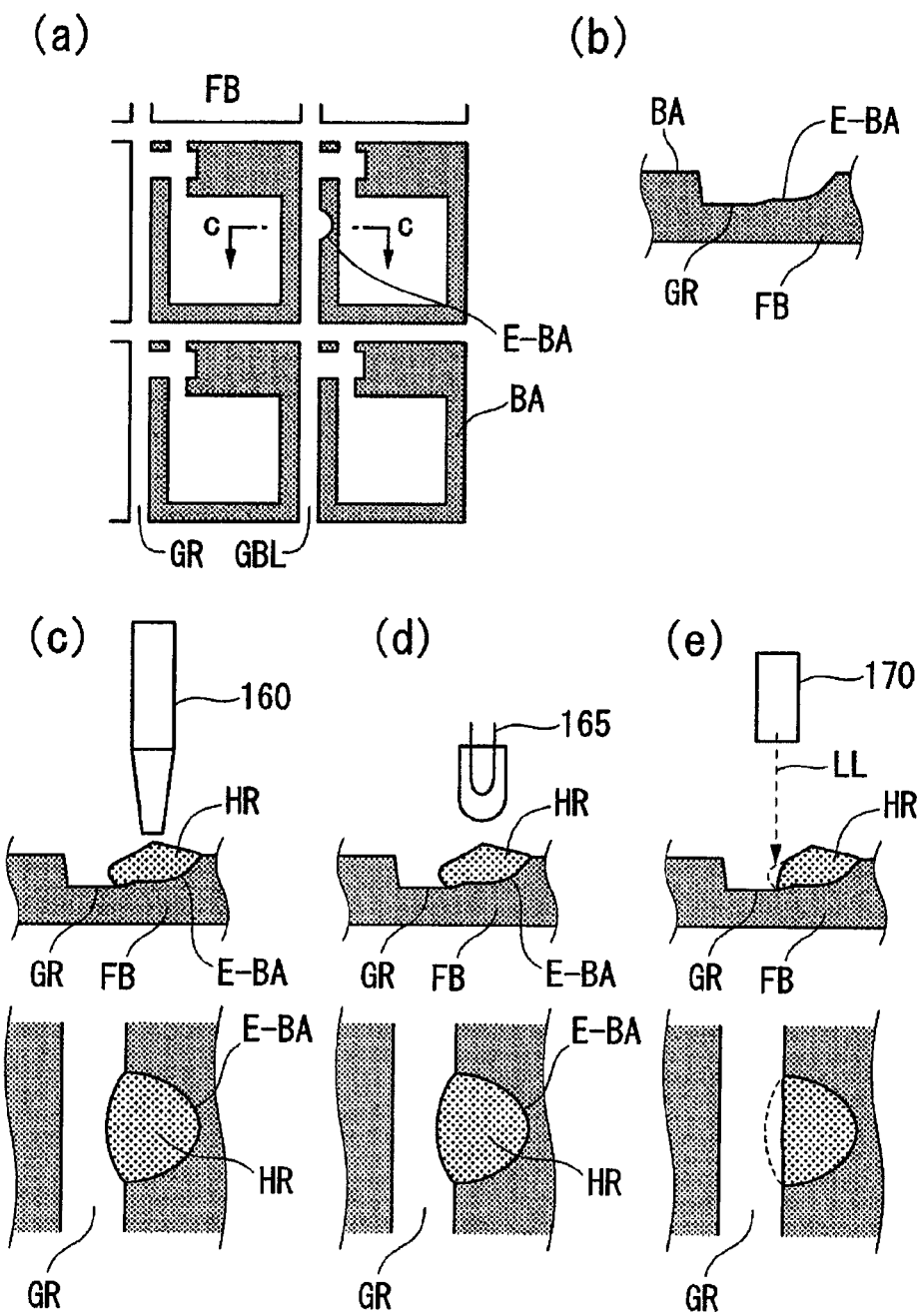
FIG. 8B is a view illustrating a process in which a partition wall BA is repaired by a partition wall repair dispenser 160.

FIG. 8B is a view illustrating a state in which a partition wall BA is repaired by the partition wall repair dispenser 160. FIG. 8B (a) is a top view of a sheet substrate FB which has been printed by the fine imprint mold 11, and FIG. 8B (b) is a cross-sectional view taken along a line c-c in FIG. 8B (a). FIG. 8B (c) through FIG. 8B (e) show the repair process.

The first monitoring apparatus CH1 shown in FIG. 4 monitors defective portions in the partition walls BA for thin-film transistor wiring and in the partition walls BA for pixels.

The groove portions GR for the gates bus lines GBL shown in FIG. 8B (a) have not been formed accurately due, for example, to dirt or the like adhering to the fine imprint mold 11. As is shown in FIG. 8B (b), a defective wall portion E-BA has been created because one partition wall BA does not exist and the groove portion GR has consequently spread out.

In this case, as is shown in FIG. 8B (c), firstly the partition wall repair dispenser 160 applies a suitable quantity of the high-viscosity UV curable resin HR. A quantity which is approximately the same as the groove portion GR where the applied quantity has spread out or a slightly larger quantity than this is preferable. Next, the UV curable resin HR is cured by the UV lamp 165. As is shown in FIG. 8B (d), the applied UV curable resin HR narrows the width of the groove portion GR. Because of this, as is shown in FIG. 8B (e), excess UV curable resin HR is removed by the laser zapping apparatus 170. The laser zapping apparatus 170 irradiates a femtosecond laser using a galvano-mirror or the like.

Figure 8C:
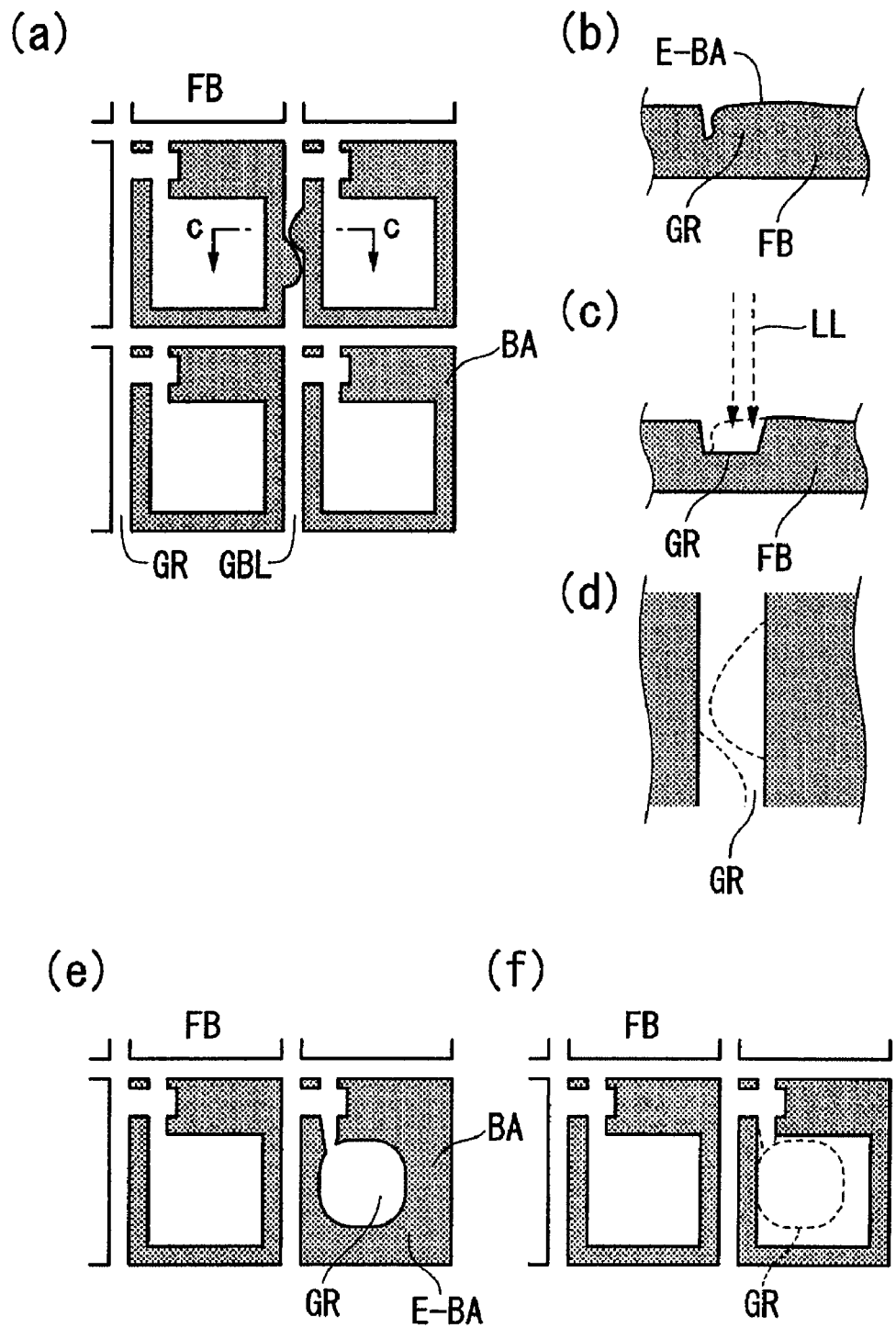
FIG. 8C is a view illustrating a process in which a partition wall BA is repaired by a laser zapping apparatus 170.

FIG. 8C is a view illustrating a process in which a partition wall BA is repaired by the laser zapping apparatus 170. FIG. 8C (a) is a top view of a sheet substrate FB which has been printed by the fine imprint mold 11, and FIG. 8C (b) is a cross-sectional view taken along a line c-c in FIG. 8C (a). FIG. 8C (c) and FIG. 8C (d) show a repair process for the groove portion GR of the gate bus line GBL. FIG. 8C (e) and FIG. 8C (f) show a repair process for the groove portion GR of the pixel area.

If it is found as a result of the first monitoring apparatus CH1 monitoring the partition wall BA for the thin-film transistor wiring and the partition wall BA for the pixels that a portion which should be a groove portion GR has become filled in and created the defective wall portion E-BA, then the partition wall repair dispenser 160 is no longer necessary. Namely, it is possible to repair the defective wall portion E-BA of the partition wall BA for the thin-film transistor wiring and the partition wall BA for the pixels using only the laser zapping apparatus 170. The dotted line shown in FIG. 8C (d) and FIG. 8C (f) shows a range prior to the removal by the laser zapping apparatus 170.

Returning to FIG. 8A, when the partition wall BA has been repaired, the metal ink MI or the like is applied by the gate repair droplet applying apparatus 120G and the organic EL element 50 is then repaired. The remover 115 is located at the final process of the repair apparatus 110 of organic EL element. The remover 115 removes the portions where the partition wall BA protrudes higher than the design value as a result of the imprinting, or removes the portions where cured UV curable resin HR protrudes higher than the design value, or removes metal ink MI which has been applied in different locations from those of the design values. Specifically, defective portions are sublimated by a laser or the like, or defective portions are cut away by a knife 117.

In the repair apparatus 110 of organic EL element, the wind-up roll RE onto which the sheet substrate FB has been wound in a roll shape in the final process of the manufacturing apparatus 100 is installed in a repair supply roll FRL. Because of this, the repair apparatus 110 feeds the sheet substrate FB in the −X-axial direction which is the opposite from the +X-axial direction which is the fundamental traveling direction of the manufacturing apparatus 100. Namely, the repair apparatus 110 feeds the sheet substrate FB from the terminal end of the wind-up roll RE onto which the sheet substrate FB has been wound by the manufacturing apparatus 100 towards the front end thereof, and the sheet substrate FB is wound onto the repair wind-up roll FRE.

The repair supply roll FRL and the repair wind-up roll FRE are constructed such that the amount by which their speed can be varied is greater than that of the supply roll RL and wind-up roll RE of the manufacturing apparatus 100. If it is assumed that a plurality of repair portions exist between 102 meters and 105 meters from the terminal end in a sheet substrate FB having a length of 200 meters or more, the repair supply roll FRL and the repair wind-up roll FRE are rotated at high speed to the vicinity of the 102 meters, and are thereafter rotated at low speed so as to move the sheet substrate FB to the repair portion located 102 meters from the terminal end. By performing this type of operation, the repair apparatus 110 is able to shorten the repair time taken up by the batch processing.

An eleventh alignment camera CA11 is located downstream of the repair supply roll FRL in the −X-axial direction. The eleventh alignment camera CA11 detects the first marks AM and second marks BM, or the first marks AM and third marks CM described in FIG. 2A and FIG. 2B. When repair portions exist between 102 meters and 105 meters from the terminal end of a sheet substrate FB having a length of 200 m or more, the sheet substrate FB is fed forward at high speed. Because of this, the repair main control unit 190 confirms the feed position of the sheet substrate FB based on image signals of the second marks BM or third marks CM formed at intervals of a plurality of rows (multirow) of organic EL elements 50. When the repair portion is approached, the sheet substrate FB is fed forward to the row number of the organic EL element 50 where the repair portion is located using the first marks AM.

An eleventh monitoring apparatus CH11 is located in the final process of the repair apparatus 110 in order to confirm whether or not the repair has been made perfectly. It is also possible for an eleventh monitoring apparatus CH11 to be provided not only in the final process, but in each repair process.

Note that, in FIG. 8A, a description of the repair processes subsequent to the droplet applying apparatus 20 of light emitting layer has been omitted, however, it is of course possible to also provide a repair droplet applying apparatus 120 for the light emitting layer.

Figure 8D:
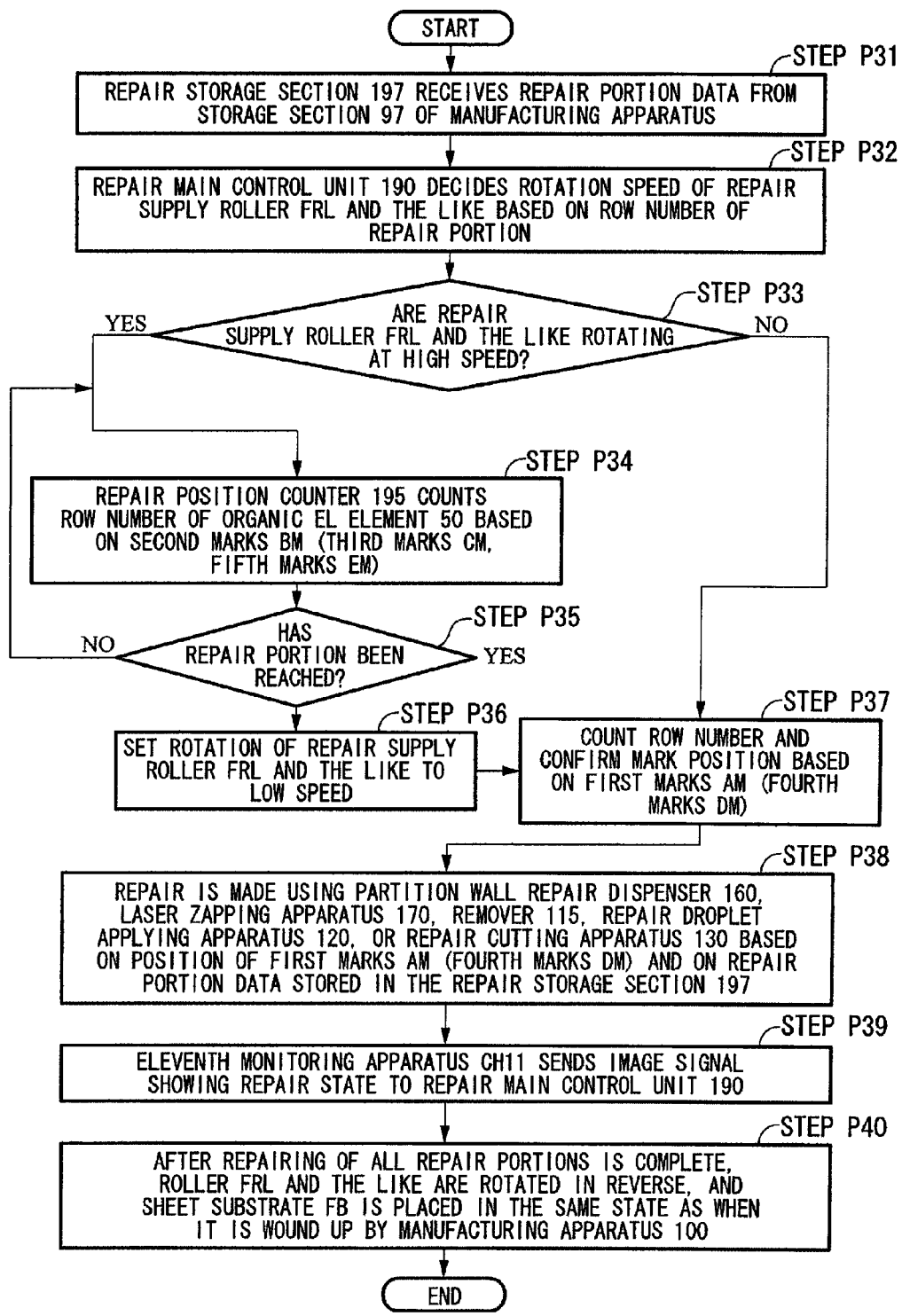
FIG. 8D is a repair flowchart for the repair apparatus 110 of the batch processing shown in FIG. 8A.

FIG. 8D is a repair flowchart for the batch processing shown in FIG. 8A performed by the repair apparatus 110.

In step P31, the repair storage section 197 receives repair portion data from the storage section 97 of the manufacturing apparatus 100. As a result, the repair main control unit 190 ascertains repair portions where repairs need to be made.

In step P32, the repair main control unit 190 decides the rotation speed of the repair supply roller FRL and the like based on the number of the row where the repair portion is located. For example, if a repair portion exists in a location close to the terminal end of the wind-up roll RE which is wound by the manufacturing apparatus 100, the repair main control unit 190 decides that the repair supply roller FRL and the like are to be rotated at a low speed. Conversely, if a repair portion exists in a location some distance from the terminal end of the wind-up roll RE, the repair main control unit 190 decides that the repair supply roller FRL and the like are to be rotated at a high speed. By controlling the rotation speed in this manner, it is possible to shorten the movement time to the repair portions. The repair main control unit 190 feeds the sheet substrate FB in the −X-axial direction at this decided rotation speed.

In step P33, the repair main control unit 190 determines whether or not the repair supply roller FRL and the like are rotating at high speed. If they are rotating at high speed, the routine moves to step P34, and if they are rotating at low speed, the routine moves to step P37.

In step P34, the repair position counter 195 counts the row number of the organic EL element 50 based on the second marks BM shown in FIG. 2A, the third marks CM shown in FIG. 2B, or the fourth marks DM or fifth marks EM shown in FIG. 2C. In this row number count, the row number gradually decreases because the sheet substrate FB is being fed in the −X-axial direction.

In step P35, the repair main control unit 190 determines whether or not the repair portion has been reached based on the count results for the row number made by the repair position counter 195. If the repair portion has been reached, the routine moves to step P36, and if the repair portion has not been reached, the routine returns to step P34.

In step P36, the repair main control unit 190 sets the rotation of the repair supply roller FRL and the like to low speed.

Next, in step P37, the row number is counted based on the first marks AM and the position is confirmed using the first marks AM as alignment marks. The repair main control unit 190 then confirms tilting or shift of the sheet substrate FB in the Y-axial direction.

In step P38, the defective portion in the organic EL element 50 is repaired based on the position of the first marks AM and on the repair portion data stored in the repair storage section 197. If the defect is in a partition wall BA, then the partition wall repair dispenser 160, the laser zapping apparatus 170 or the remover 115 repair the defective portion. If the defect is an applying defect in the metal ink MI in a pixel area, then the defect metal ink MI is removed by the laser zapping apparatus 170 and the metal ink MI is newly applied by the repair droplet applying apparatus 120SD. In this manner, the repair main control unit 190 selects an appropriate repair process for the situation in accordance with the defect content of the repair portion.

In step P39, the eleventh monitoring apparatus CH11 sends an image signal showing the repair state to the repair main control unit 190. The repair main control unit 190 then confirms whether or not the repair portion has been completely restored.

Once the repairing of all the repair portions is complete, the roller FRL and the like are rotated in reverse so that the sheet substrate FB is placed in the same state as when it is wound up by the manufacturing apparatus 100 (step P40).

Note that the feeding speed of the sheet substrate FB by the repair supply roller FRL and the like has been described in two speeds, namely, low speed and high speed, however, it is also possible to set three or more levels of speed. It is preferable for the speed control to be a type of feedback control such as PID control or the like.

Moreover, in the above described flow chart, the repair apparatus 110 confirms the first marks AM (or fourth marks DM) and second marks BM (or third marks CM and fifth marks EM) and makes the repairs during the movement of the sheet substrate FB in the −X-axial direction. However, once all of the sheet substrate FB has been fed in the −X-axial direction, it is also possible for the repair apparatus 110 to make the repairs during the movement of the sheet substrate FB in the X-axial direction.

[Manufacturing and Repair Apparatus of Organic EL Element]

Figure 9:
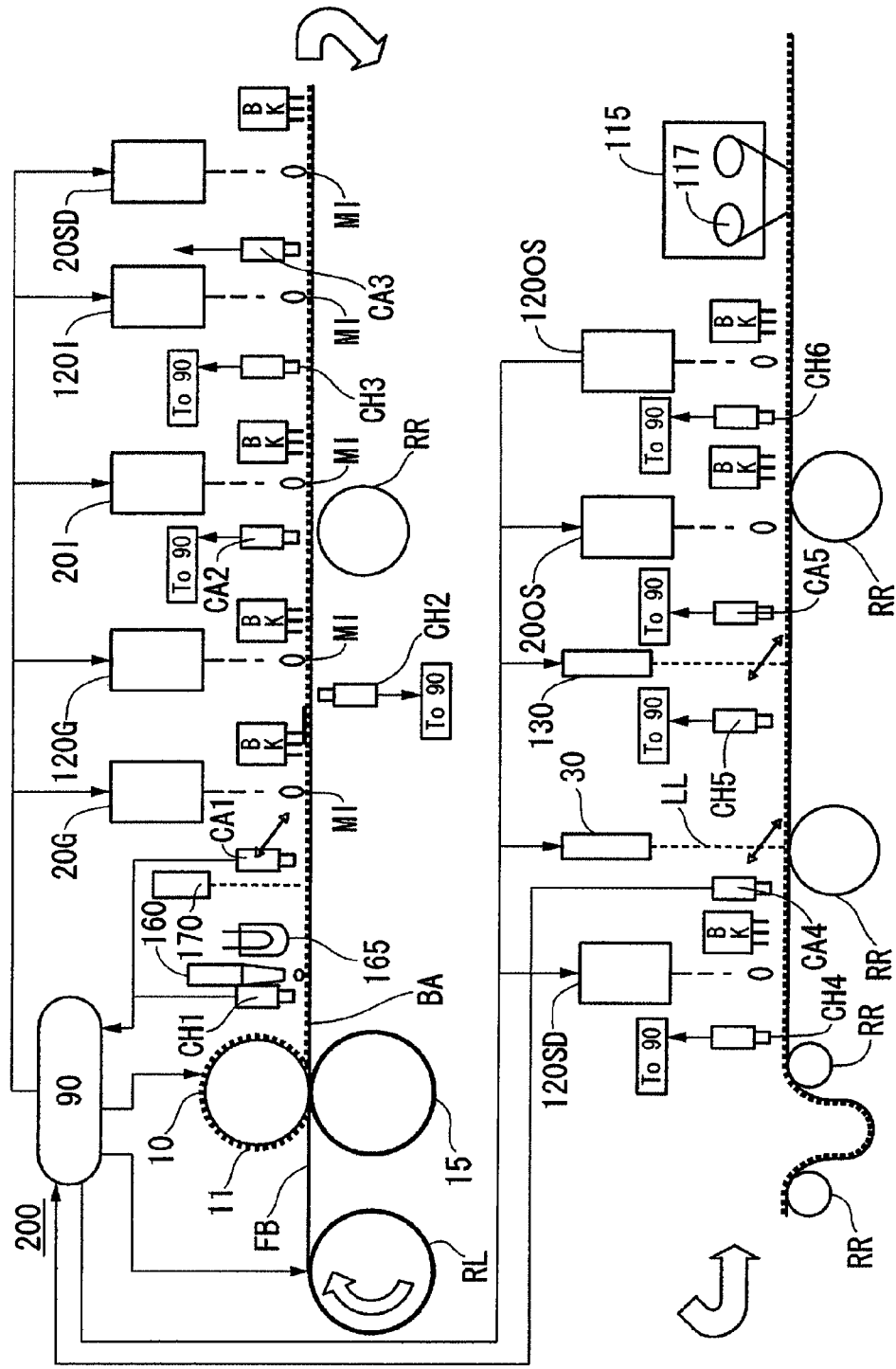
FIG. 9 is a schematic view showing a manufacturing and repairing apparatus 200 that monitors defective portions as it manufactures an organic EL element 50, and repairs the defective portions in-line.

FIG. 9 is a schematic view showing a manufacturing and repair apparatus 200 which monitors defective portions while manufacturing an organic EL element 50, and if defective portions occur, performs the in-line repair of these defective portions. Note that processes subsequent to the light emitting layer process are not shown in FIG. 9. Moreover, in FIG. 9, the same symbols are used for devices which are the same as those of the manufacturing apparatus 100 shown in FIG. 1 and those of the repair apparatus 110 shown in FIG. 8A.

The sheet substrate FB which has been fed from the supply roll RL is pressed down by the imprint roller 10, and the sheet substrate FB is heated by the heat transfer roller 15 to the glass transition point or more so that the pressed partition walls BA are able to maintain their shape.

The first monitoring apparatus all, the partition wall repair dispenser 160, and the laser zapping apparatus 170 are located downstream of the imprint roller 10 in the X-axial direction. The gate repair droplet applying apparatus 120G is located downstream of the laser zapping apparatus 170. The first monitoring apparatus CH1 monitors whether or not the partition walls BA for the display electrodes and for the thin-film transistor wiring are being formed accurately. If a defective portion in the partition walls BA is discovered by this first monitoring apparatus CH1, the partition wall repair dispenser 160 applies UV curable resin HR onto the sheet substrate FB. The resin is then cured by the UV ray lamp 144 so that the defective portion of the partition wall BA is repaired. If excess partition wall BA is formed, then the excess partition wall BA is removed by the laser zapping apparatus 170. The first alignment camera CA1 is located downstream of the laser zapping apparatus 170.

The sheet substrate FB moves to the electrode formation process after the first marks AM and second marks BM have been detected by the first alignment camera CA 1.

In the electrode formation process, the gate droplet applying apparatus 20G receives position information from the first alignment camera CA1, and applies metal ink MI onto groove portions GR between the partition walls BA of the gate bus line GBL with the metal ink MI. The metal ink MI is then dried or baked by the heat processing apparatus BK.

The second monitoring apparatus CH2 is located downstream of the gate droplet applying apparatus 20G, and the gate repair droplet applying apparatus 120G is located downstream of the second monitoring apparatus CH2. The second monitoring apparatus CH2 monitors whether or not the metal ink MI has been applied onto the gate bus line GBL and is functioning as a conductive line. If a defective portion is discovered in the gate bus line GBL by this second monitoring apparatus CH2, the gate repair droplet applying apparatus 120G applies the metal ink MI onto the sheet substrate FB. The second alignment camera CA2 is located downstream of the gate repair droplet applying apparatus 120G.

Thereafter, in the same way, the insulating layer droplet applying apparatus 20I and the like also perform a monitoring process after the manufacturing process, and if a defective portion is discovered in the monitoring process, the defective portion is repaired in a repair process. Note that, in the manufacturing and repair apparatus 200 shown in FIG. 9, the remover 115 is provided after the organic semiconductor repair droplet applying apparatus 20OS, however, it is also possible for a plurality of removers 115 to be provided, for example, after the imprint roller 10, or after each droplet applying apparatus 20 or the like.

Note also that the time required to manufacture an organic EL element 50 does not necessarily match the time required to repair a defective portion in the same process. Moreover, the processing in the imprint process and the processing in each applying process are not finished in the same time. Because of this, when performing manufacturing or repairs in-line, it is necessary to rotate the supply roller RL so as to match the speed of the process which takes the longest time. Because this makes it impossible to raise productivity, if, for example, the process which takes the longest time is the process in which defective portions are removed by the remover 115, then productivity can be raised as much as possible by providing two removers 115, or by allowing the sheet substrate FB to be hang loosely as is shown at the left side in the bottom half of FIG. 9.

INDUSTRIAL APPLICABILITY

Descriptions of manufacturing apparatus and repair apparatus of organic EL element have been given above. However, the manufacturing apparatus and repair apparatus can also be applied to field emission displays and liquid crystal display elements and the like. The present embodiment has been described using a thin-film transistor which employs an organic semiconductor. However, the present invention can also be applied to a thin-film transistor of an amorphous silicon-based inorganic semiconductor.

Moreover, heat processing apparatuses BK are provided in the manufacturing apparatus 100, the repair apparatus 110, and the manufacturing and repair apparatus 200 of the embodiments. However, with the improvements in metal inks MI or light emitting layer solvents and the like, inks and solvents which do not require heat processing have been proposed. Because of this, the heat processing apparatuses BK is not necessary to be provided in these embodiments as well.

The invention claimed is:

1. A method for manufacturing display element comprising:
    feeding a substrate in a first direction;
    forming a partition wall for a plurality of display elements by pressing a mold onto the fed substrate, in which the display elements are lined up in a second direction that intersects the first direction;
    forming at least one first index mark for display elements by pressing the mold onto the fed substrate;
    applying droplets onto a groove portion formed between the partition walls;
    monitoring whether the partition wall formed by the mold or the applied droplets are acceptable or defective; and
    storing a position of a defective portion in the first direction using the first index mark, in which the defective portion is confirmed as being defective.

2. The method for manufacturing display element according to claim 1, further comprising forming a second index mark by pressing the mold onto the fed substrate, in which one second index mark is formed for every multirow of the display elements which are lined up in the second direction.

3. The method for manufacturing display element according to claim 2, wherein the mold comprises a rotating mold which is formed on a surface of a circular column; and the partition wall, the first index mark, and the second index mark are formed simultaneously by rotating of the rotating mold.

4. The method for manufacturing display element according to claim 2, wherein the applying of droplet comprise aligning a position for the applying of the droplets based on the first index mark or the second index mark.

5. The method for manufacturing display element according to claim 2, further comprising:
    winding up the substrate which has completed the applying of droplets; and
    repairing the defective portion comprising unwinding the substrate which was temporarily wound up in the winding up of substrate to the position stored in the storing of position in which the first index mark and the second index mark are used.

6. The method for manufacturing display element according to claim 1, wherein the mold comprises a rotating mold which is formed on a surface of a circular column; and the partition wall and the first index mark are formed simultaneously by rotating of the rotating mold.

7. The method for manufacturing display element according to claim 1, further comprising calculating number of the first index mark by monitoring the first index mark; and forming a third index mark which shows predetermined row number based on the calculating of the number, in which the third index mark is formed for the predetermined row of the display elements which are lined up in the second direction.

8. The method for manufacturing display element according to claim 7, further comprising:
   winding up the substrate which has completed the applying of droplets; and
   repairing the defective portion comprising unwinding the substrate which was temporarily wound up in the winding up of substrate to the position stored in the storing of position in which the first index mark and the third index mark are used.

9. The method for manufacturing display element according to claim 1, further comprising:
   winding up the substrate which has completed the applying of droplets; and
   repairing the defective portion comprising unwinding the substrate which was temporarily wound up in the winding up of substrate to the position stored in the storing of position in which the first index mark is used.

10. The method for manufacturing display element according to claim 1, further comprising:
    repairing the defective portion stored in the storing of position,
    wherein the mold forms at least one first index mark for one row of display elements.

11. The method for manufacturing display element according to claim 1, wherein the first index mark is a diffraction grating.

12. The method for manufacturing display element according to claim 1, wherein the substrate has flexibility.

13. A manufacturing apparatus of display element comprising:
    a supply roll that feeds a substrate in a first direction;
    a mold that, by pressing onto the fed substrate, forms at least one first index mark for display elements and a partition wall for a plurality of display elements which are lined up in a second direction which intersects the first direction;
    a droplet applying section that applies droplets onto a groove portion formed between the partition walls;
    a monitoring section which monitors whether the partition wall formed by the mold or the droplets applied by the droplet applying section are acceptable or defective; and
    a storage section which stores a position of a defective portion in the first direction using the first index mark, in which the defective portion is confirmed as being defective by the monitoring section.

14. The manufacturing apparatus of display element according to claim 13, wherein the mold forms one second index mark for every multirow of the display elements which are lined up in the second direction.

15. The manufacturing apparatus of display element according to claim 13 or claim 14, further comprising:
    a calculation section which calculates number of the first index mark by monitoring the first index mark; and
    a third index mark formation section which forms a third index mark which shows a predetermined row number based on the number of the first index mark, in which the third index mark is formed for the predetermined row of the display elements which are lined up in the second direction.

16. The manufacturing apparatus of display element according to claim 13, further comprising:
    a repair section which repairs the defective portion stored by the storage section.

17. The manufacturing apparatus of display element according to claim 16, further comprising:
    a wind-up roll onto which the substrate which has passed through the droplet applying section is wound,
    wherein the repair section unwinds the substrate which was temporarily wound onto the wind-up roll to the position stored by the storage section using the first index mark, and repairs the defective portion.

18. The manufacturing apparatus of display element according to claim 13, wherein the first index mark is a diffraction grating.

19. The manufacturing apparatus of display element according to claim 13, wherein the substrate has flexibility.

20. The manufacturing apparatus of display element according to claim 13, wherein the mold forms at least one first index mark for one row of display elements.

* * * * *